(12) United States Patent
Cohen et al.

(10) Patent No.: US 8,264,581 B2
(45) Date of Patent: Sep. 11, 2012

(54) CMOS PHOTOGATE 3D CAMERA SYSTEM HAVING IMPROVED CHARGE SENSING CELL AND PIXEL GEOMETRY

(75) Inventors: David Cohen, Nesher (IL); Amit Shacham, Kibbutz Givat Haim (IL)

(73) Assignee: Microsoft International Holdings B.V., Amsterdam (NL)

( * ) Notice: Subject to any disclaimer, the term of this patent is extended or adjusted under 35 U.S.C. 154(b) by 320 days.

(21) Appl. No.: 12/504,687

(22) Filed: Jul. 17, 2009

(65) Prior Publication Data

US 2010/0039546 A1 Feb. 18, 2010

Related U.S. Application Data

(60) Provisional application No. 61/081,400, filed on Jul. 17, 2008.

(51) Int. Cl.
*H04N 3/14* (2006.01)
*H04N 5/335* (2011.01)
(52) U.S. Cl. .................. 348/308; 257/292
(58) Field of Classification Search ............ 348/207.99, 348/294, 301, 302, 307, 308; 257/291, 292, 257/315; 250/208.1; 600/448
See application file for complete search history.

(56) References Cited

U.S. PATENT DOCUMENTS

| | | | |
|---|---|---|---|
| 4,878,120 A * | 10/1989 | Matsumoto et al. .......... | 348/307 |
| 5,625,210 A | 4/1997 | Lee et al. | |
| 5,955,753 A * | 9/1999 | Takahashi ..................... | 257/292 |
| 6,008,486 A * | 12/1999 | Stam et al. ................. | 250/208.1 |
| 6,239,456 B1 | 5/2001 | Berezin et al. | |
| 6,320,617 B1 | 11/2001 | Gee et al. | |
| 6,897,519 B1 * | 5/2005 | Dosluoglu ..................... | 257/315 |
| 7,119,322 B2 | 10/2006 | Hong | |
| 7,187,018 B2 | 3/2007 | Mouli et al. | |
| 7,342,454 B2 | 3/2008 | Sekimoto et al. | |
| 2004/0201047 A1 * | 10/2004 | Takamura ..................... | 257/292 |
| 2004/0245433 A1 * | 12/2004 | Koyama ..................... | 250/208.1 |
| 2005/0185072 A1 * | 8/2005 | Watanabe ..................... | 348/294 |
| 2006/0060897 A1 * | 3/2006 | Kuwazawa ..................... | 257/292 |

(Continued)

FOREIGN PATENT DOCUMENTS

EP 0757476 2/1997

(Continued)

OTHER PUBLICATIONS

PCT International Search Report PCT/IB2009/053113 dated Oct. 23, 2009.

(Continued)

*Primary Examiner* — Nelson D. Hernández Hernández
*Assistant Examiner* — Dennis Hogue
(74) *Attorney, Agent, or Firm* — Vierra Magen Marcus & DeNiro LLP

(57) ABSTRACT

A photosurface for receiving and registering light from a scene, the photosurface comprising: a first semiconductor region in which electron-hole pairs are generated responsive to light incident on the photosurface; a single, first conductive region substantially overlaying all of the first semiconductor region; at least one second semiconductor region surrounded by the first semiconductor region; a different second conductive region for each second semiconductor region that surrounds the second semiconductor region and is electrically isolated from the first conductive region; wherein when the second conductive region is electrified positive with respect to the first conductive region, electrons generated by light incident on the first semiconductor region are collected in the second semiconductor region.

20 Claims, 24 Drawing Sheets

U.S. PATENT DOCUMENTS

2008/0170146 A1* 7/2008 McKee .......... 348/302
2008/0258187 A1* 10/2008 Ladd et al. .......... 257/292

FOREIGN PATENT DOCUMENTS

| EP | 1995783 | 11/2008 |
|---|---|---|
| JP | 10 289992 | 10/1998 |
| JP | 2004259733 | 9/2004 |
| WO | 2009/078002 | 6/2009 |

OTHER PUBLICATIONS

Toyama, Kentaro, et al., "Probabilistic Tracking in a Metric Space," Eighth International Conference on Computer Vision, Vancouver, Canada, vol. 2, Jul. 2001, 8 pages.

Written Opinion of the International Searching Authority dated Oct. 23, 2009, Patent Cooperation Treaty, PCT Application No. PCT/IB2009/053113 filed Jul. 17, 2009.

Response to European Office Action dated Mar. 24, 2011, European Patent Office, European Patent Application No. 09786633.9 filed Jul. 17, 2009.

Alireza Moini, in Vision Chips or Seeing Silicon, Third Revision, Mar. 1997, Chapter 7 pp. 104-123.

Kawahito et al. in A CMOS Time-of-Flight Range Image Sensor With Gates-on-Field-Oxide Structure, IEEE Sensors Journal, Vol. 7, No. 12, Dec. 2007, p. 1578-1586.

Synopsys' Website at http://www.synopsys.com/contactus.html http://www.synopsys.com/Tools/TCAD/DeviceSimulation/Pages/TaurusMedici.aspx A 2D device simulator,Taurus Medici http://www.synopsys.com/Tools/TCAD/ProcessSimulation/Pages/TaurusTSupreme4.aspx.

Jong-Ho Park et al., A New Active Pixel Structure With a Pinned Photodiode for Wide Dynamic Range Image Sensors, IEICE Electronics Express, vol. 2, No. 18, pp. 482-487.

Yahav, G. et al. U.S. Appl. No. 12/344,601, filed Dec. 29, 2008.

Stuart Kleinfelder et al., Novel Integrated CMOS Pixel Structures for Vertex Detectors, Nuclear Science Symposium Conference Record, 2003 IEEE, Oct. 19-25, 2003, vol. 1, on pp. 335-339 vol. 1.

Albert Theuwissen et al., Building a Better Mousetrap, Modified CMOS processes improve image sensor performance,Spie's OEmagazine, Jan. 2001, pp. 29-32.

European Office Action dated Jun. 27, 2012, European Patent Application No. 09786633.9, filed Jul. 17, 2009, 5 pages.

* cited by examiner

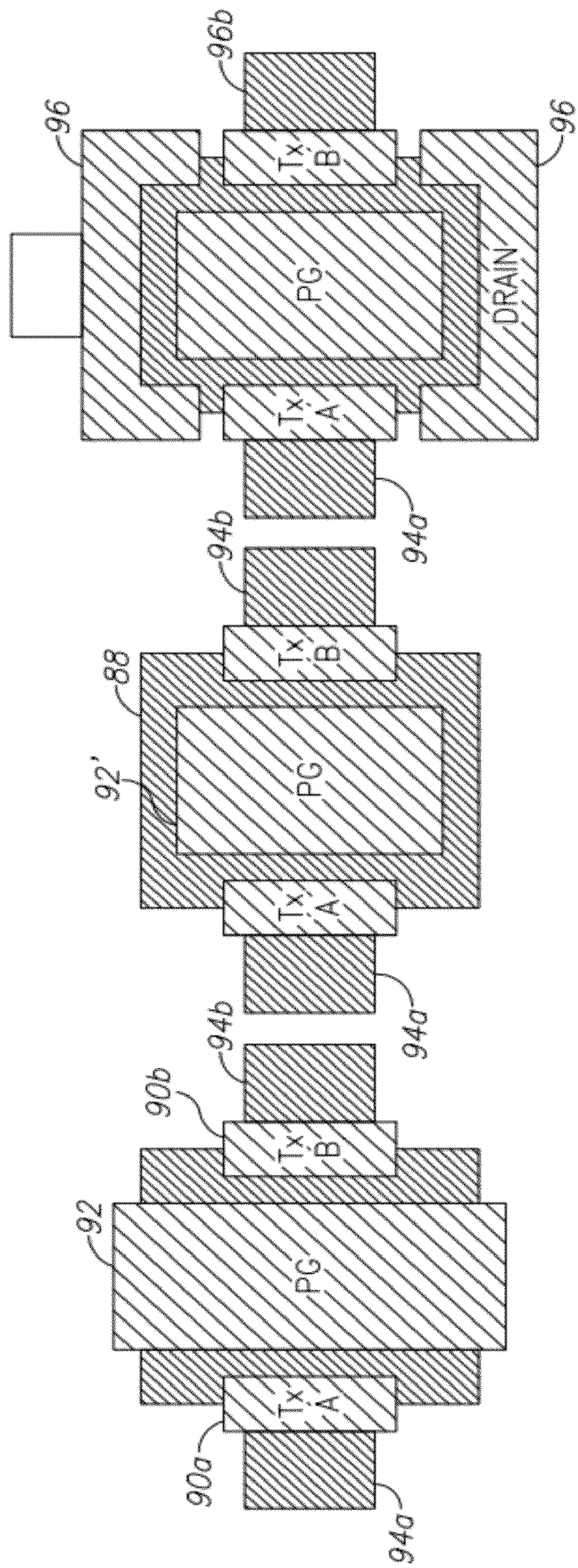

CMOS PHOTOGATE 3D CAMERA SYSTEM HAVING IMPROVED CHARGE SENSING CELL AND PIXEL GEOMETRY

CROSS-REFERENCES TO RELATED APPLICATIONS

The present application claims benefit under 35 U.S.C. §119(e) of U.S. Provisional Application 61/081,400 filed Jul. 17, 2008, the entire content of which is incorporated herein by reference.

FIELD OF THE INVENTION

The present invention relates to improvements in CMOS photogate-type 3D cameras, and more particularly to such cameras having improved charge sensing cell geometry and activation timing for time-of-flight (TOF) based ranging.

BACKGROUND

Various techniques have been developed for obtaining 3D image data and generating 3D images. One such technique involves direct imaging using a camera system that includes an electromagnetic radiation source for illuminating a subject with a modulated light signal or pulses, and determining the return time and/or signal intensity of resulting reflected radiation. This technique is generally referred to as time-of-flight (TOF) imaging, and can be implemented in various known ways, typically using infra-red (IR) or visible light. Optionally, electromagnetic radiation other than light may be employed, but for simplicity, it will be assumed in the description below that the illuminating energy is IR.

Camera systems for TOF imaging are generally comprised of an optical unit, a sensor array formed of individual detector pixels, and suitable control electronics. The sensor arrays are conventionally formed of charge-coupled devices, photo-diodes, or as photogate arrays constructed using complementary metal oxide semiconductor (CMOS) fabrication technology. A camera system of this type is shown, by way of example, in U.S. Pat. No. 7,342,454.

FIGS. 1A and 1B are plan and vertical cross-sectional views of a basic pixel structure (sometimes referred to below as an "imaging cell") for a CMOS photogate type 3D camera as known in the art. In its simplest form, a pixel 10 may be comprised of a P+ (highly doped) silicon substrate 12, a P− (lightly doped) epitaxial layer 14, an N− (lightly doped) buried channel implant 16 and first and second N+ floating diffusions 18a and 18b formed within implant 16. An oxide layer 24 is formed on top of channel implant 16. A polycrystalline silicon photogate 20 and polycrystalline silicon transfer gates 22a and 22b are formed on oxide layer 24. As shown, transfer gate 22a is positioned between photogate 20 and floating diffusion 18a, and transfer gate 22b is positioned between photogate 20 and floating diffusion 18b. Other conventional CMOS structures such as drain and source metallization, wiring, etc. are omitted for clarity and simplicity of description. Conventionally, the floating diffusions 18a and 18b, photogate 20, and transfer gates 22a and 22b are relatively elongated, generally rectangular structures.

In operation, photogate 20 is energized by application of a suitable voltage at a known time in relation to the outgoing illumination and is kept energized for a set charge collection interval. The electric field resulting from the voltage applied to photogate 20 creates a charge accumulation region in channel implant 16, and photons reflected from the subject being imaged (not shown) pass through photogate 20 into channel implant 16, and cause electrons to be released there.

Transfer gates 22a and 22b are then energized in turn for respective predetermined integration intervals. The charge collected during the integration intervals is transferred to the respective floating diffusions 18a and 18b through channel 16. This charge induces voltages that can be measured and used to determine the distance to the portion of the subject imaged by the pixel 10. The TOF is then determined from the charge-induced voltages on floating diffusions 18a and 18b, the known activation timing of gates 20, 22a and 22b, and the speed of light. The floating diffusions are thus the sensing nodes of the CMOS photogate sensing pixel.

FIGS. 2A and 2B are top and cross-sectional views of a known variation of the principles shown in FIGS. 1A and 1B. Here an imaging cell 30, in addition to the structural elements described above, is provided with a stop channel structure 32 (sometimes referred to in the art as a "channel stop"). Stop channel 32 is comprised of a P-Well 32 formed along the sides of photogate 20 between transfer gates 22a and 22b, and extending down through buried channel 16 and into P− epitaxial layer 14. Stop channel 32 also includes a P+ diffusion 34 formed below oxide layer 24 overlapping the tops of P-Well 32 and channel 16. A conventional outer silicon trench isolation structure 36 may also be provided. Charge transferred from the ends of channel 16 opposite the activated transfer gate tends to be uncontrolled and noisy if the channel is not sharply terminated. Stop channel 32 provides well-defined terminations at the ends of channel 16 to help promote controlled charge transfer to floating diffusions 18a and 18b.

FIGS. 3A and 3B show a conventional cell control and readout arrangement generally designated at 40, for the photogate cells described above. In FIGS. 3A and 3B, cell 10 (FIGS. 1A and 1B) is shown by way of example, but the same cell control and readout arrangement is applicable to cell 30 (FIGS. 2A and 2B) as well.

Signal paths 42 and 44a, 44b respectively energize photogate 20 and transfer gates 22a and 22b. Output circuits 46a and 46b provide readout of the charge-induced voltages on floating diffusions 18a and 18b respectively. Select and reset signals for output circuits 46a and 46b are respectively provided on signal paths 48 and 50.

FIG. 4 illustrates use of background illumination cancellation for TOF pixel cells as described by Kawahito et al. in *A CMOS Time-of-Flight Range Image Sensor, IEEE Sensors Journal*, December 2007, p. 1578. In systems employing pulsed illumination, background illumination may result in charge accumulation in the sensor cell during the intervals between illumination pulses. Under such circumstances, it may be advantageous drain such charge accumulation before initiation of each illumination cycle.

Thus, referring to FIG. 4, a pixel cell 60, shown for simplicity as having the same basic construction as cell 10 in FIGS. 1A and 1B, is modified to include background charge draining electrodes 62 coupled by signal paths 64 and 66 to Vdd line 68. An activation signal line 70 completes a discharge path for the draining electrodes. Output circuits 46a and 46b (see FIGS. 3A and 3B) are as previously described.

According to conventional practice, photogate cells as described in connection with FIGS. 1-4 above form pixels which are comprised in a 3D camera pixel array. The number of basic cells employed in a single pixel depends on the sensitivity (i.e., charge collection capability) required for a given application. For example, in mobile phone cameras or other close-up applications, a single cell per pixel may be sufficient, while in long-distance applications such as automotive ranging for which high illumination levels might pose eye-safety or other issues, multiple cells per pixel might be needed.

FIG. 5 is a greatly enlarged photo-illustration of a portion of a pixel array 80 formed by way of example comprising four cells as described above. FIGS. 6A and 6B show two alternative layouts for the cells in FIG. 5. In FIG. 6A, transfer gates 84a and 84b are of substantially the same length as photogate 86. In FIG. 6B, photogate 86' is shorter than transfer gates 84a' and 84b', and also shorter than channel 88. The underlying construction of array 80 is shown in the sectional views in FIGS. 6C and 6D.

FIGS. 7A-7C show alternative known cell geometries that are also compatible with the construction of FIG. 5. The geometry of FIG. 7A is similar to that of FIG. 6A except that transfer gates 90a and 90b are substantially shorter that photogate 92, and floating diffusions 94a and 94b are shorter still. The geometry of FIG. 7B is like that of FIG. 6B, with photogate 92' being shorter than transfer gates 90a' and 90b', and also shorter than channel 88. The arrangement of FIG. 7C is like that of FIG. 7B, but includes background illumination charge draining electrodes as discussed above in connection with FIG. 4.

The cell geometry options illustrated in FIGS. 6A and 6B, and FIGS. 7A-7C suffer from several disadvantages. For one thing, the capacitance of diffusions such as 82a and 82b shown in FIG. 5, and 94a and 94b shown in FIGS. 7A-7C is a function of both peripheral length and surface area. In the configurations shown in FIGS. 6A and 6B, diffusions 82a and 82b are made long to accommodate a large required area for photogates 86 so the resulting capacitance is quite high. Since the voltage induced at the floating diffusions by a given level of charge is inversely related to the capacitance, the arrangements of FIGS. 6A and 6B exhibit low sensitivity to small charge variations.

The capacitance of floating diffusions 94A and 94b in FIGS. 7A-7C is smaller than in the case of the arrangements of FIGS. 6A and 6B, which results in better sensitivity to small charge variations. However, the smaller size and positioning of the floating diffusions 94a and 94b relative to photogate 92, results in considerable variation in the distance between the floating diffusions and the different regions of the charge accumulation region under the photogate. Consequently, directional non-uniformity exists in the electric field between the floating diffusions and the photogate. This causes degradation in the transfer characteristics, i.e., variation in the time required for electrons to travel through channel 88 to the floating diffusions.

Moreover, in both layouts, the fill factor, defined as the area available for collection of electrons, i.e., by the floating diffusions, divided by the total pixel area is relatively low (typically in the 25-40% range), which, in turn requires an undesirably large pixel area and array size for a given light collecting ability.

There is accordingly a need for improved cell geometry and pixel architecture. The present invention seeks to meet this need, as well as others.

BRIEF DESCRIPTION

According to some embodiments of the invention, CMOS photogate basic unit cells are comprised of first and second floating diffusions and their associated transfer gates, and a photogate, optionally formed on a conventional substrate, epitaxial layer, and buried channel implant, with the floating diffusions formed within the channel implant. However, instead of the transfer gates being located in linearly spaced relationship between the photogate and the respective floating diffusions, the transfer gates are formed as ring-like structures that surround the respective floating diffusions. For clarity, these structures will sometimes be referred to below as "transfer gate rings", and the composite of a floating diffusion and its associated transfer gate ring will sometimes be referred to as a "charge sensing element".

It is also to be understood that the floating diffusions are located within the buried channel implant, and therefore the "surrounding" transfer gates, which are above the oxide layer, form what may be regarded as a "halo", rather than a demarcating border. For simplicity, however, the term "surrounding" will be used in reference to arrangement as it actually exists.

Optionally, according to some embodiments of the invention, multiple basic unit cells may be combined to form a pixel depending on the light-gathering capability required for a particular application.

In some embodiments of the invention, the sensing elements are accessible for wiring through perforations in an extended photogate body. Optionally, according to some embodiments of the invention, a single photogate may be employed for an entire pixel, or for an entire pixel array.

Pixels formed of these cells are characterized by low capacitance, and consequently can provide improved sensitivity to small changes in charge accumulation compared to the prior art. At the same time, the electric field created by the voltage applied to the photogate is substantially azimuthally symetric around the sensing element, and the inventors have found that electrons traveling from the charge accumulation region defined by the electrified photogate body through the channel to the floating diffusions experience substantially no obstructions as a function of travel direction. This can result in improved transfer characteristics.

Pixels and pixel arrays formed of charge sensing elements according to some embodiments of the invention also exhibit a substantially improved fill factor over the prior art. Fill factors of 60 percent or more are achievable According to some embodiments of the invention, the basic unit cells described above may be constructed to include background illumination cancellation. This may be accomplished by including charge draining elements and associated transfer gates that are energized during the intervals between emission of the illuminating pulses. Optionally, the floating diffusions and the associated transfer gates can also be used for background cancellation. Optionally, the photogates may also be used for background cancellation.

According to some embodiments of the invention, the background charge draining elements are constructed similarly to the charge sensing elements described above, with a central N+ floating diffusion connected to the drain potential, and a transfer gate ring like those provided for the charge sensing elements. When the drain element transfer gate ring is energized, the electric field resulting from the applied voltage transfers electrons released by impingement of background light photons on the photogate in preparation for the next illumination pulse.

According to some embodiments of the invention, pixels may be formed of basic pixel building blocks, each building block being comprised of two or more basic unit cells, either with or without background cancellation. In some embodiments of the invention employing such building blocks, one of the basic unit cells may be modified to form a second kind of building block. In some such embodiments, a pixel may be formed of a single second (modified) building block, and one or more first (unmodified) building blocks.

In some embodiments of the invention that provide for background cancellation, the modified building block may be formed by replacing the background charge draining element with an active output driver unit, for coupling the voltage induced on the sensing units as a pixel output signal. For embodiments of the invention in which the sensing units do not include separate background charge draining elements, modified building blocks may be formed by replacing one of the charge sensing elements with an output driver unit.

According to some embodiments of the invention, pixels formed of basic unit cells and building blocks as described above, can include P-wells, P+ diffusions and silicon trench isolation structures to form stop channels to promote uniform channel termination.

In some embodiments of the invention, channel termination uniformity may be improved by employment of an array border arrangement that provides a grounded isolation region. This may be comprised of a shallow trench isolation (STI) region that seats in a P-well surrounding the pixel array. An N+ diffusion forms an inside border of the STI region. A stop gate channel surrounds the photogate and is located along and optionally slightly overlays the N+ diffusion. The stop gate channel, N+ diffusion, and STI well are biased at the substrate voltage.

BRIEF DESCRIPTION OF THE DRAWINGS

Examples illustrating several embodiments of the invention are described below with reference to the attached drawings, in which:

FIGS. 7A through 7C are schematic plan views of variants for the photogate structure shown in FIGS. 5A, 6A, and 6B;

Figures 1A, 1B:
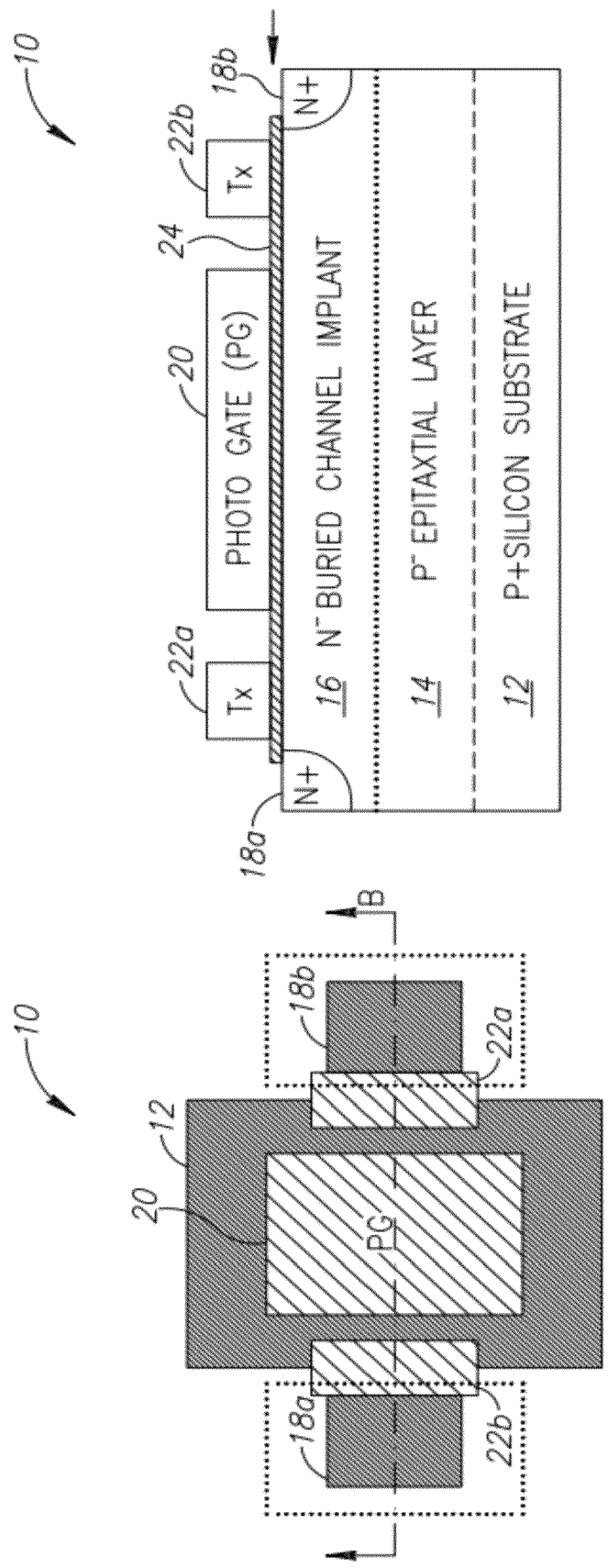
FIG. 1A is a plan view of a conventional CMOS cell for a photogate type 3D camera.
FIG. 1B is a vertical cross-sectional view taken along line B-B in FIG. 1A.
Figures 2A, 2B:
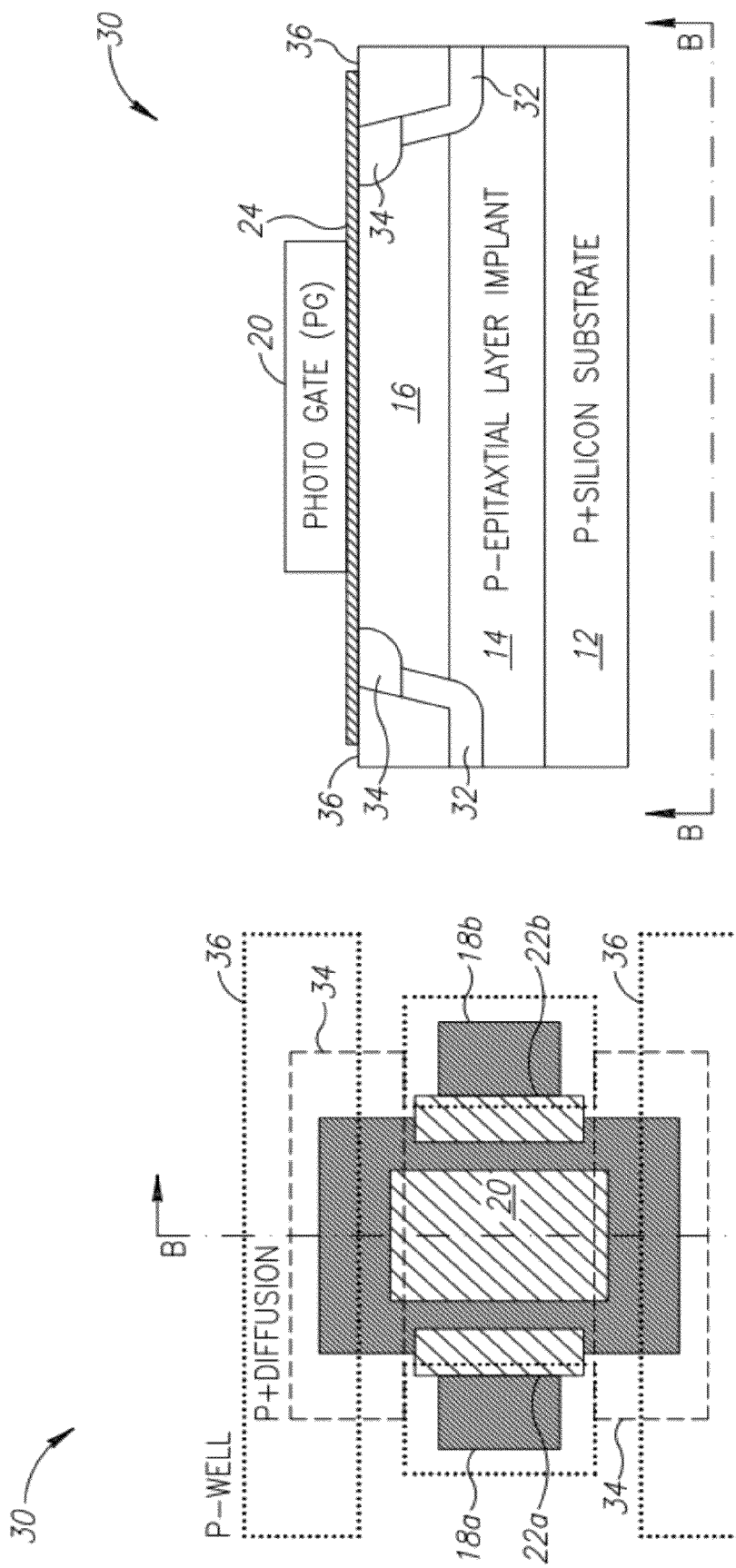
FIG. 2A is a plan view of the cell shown in FIGS. 1A and 1B including a P+ stop channel to improve isolation of the sensing cells from outside randomly induced charge.
FIG. 2B is a vertical cross-sectional view taken along line B-B in FIG. 2A.

In the drawings, identical structures, elements or parts that appear in more than one figure are generally designated by the same reference sign in all the figures in which they appear. Dimensions of components and features shown in the figures are generally chosen for convenience and clarity of presentation and are not necessarily drawn to scale.

DETAILED DESCRIPTION

Figure 8A:
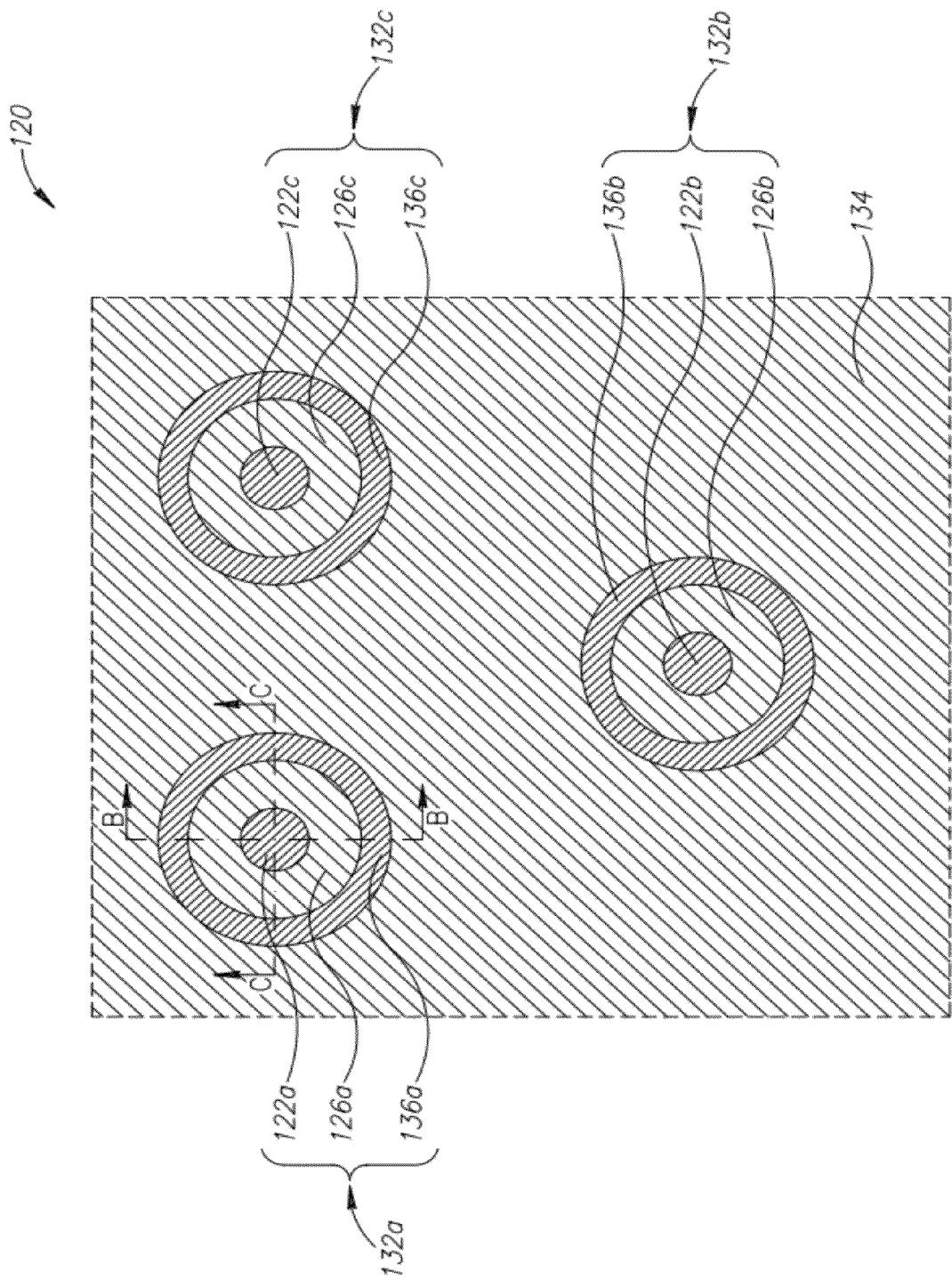
FIG. 8A is a schematic plan view a basic unit photogate cell according to an embodiment of the invention.
Figure 8B:
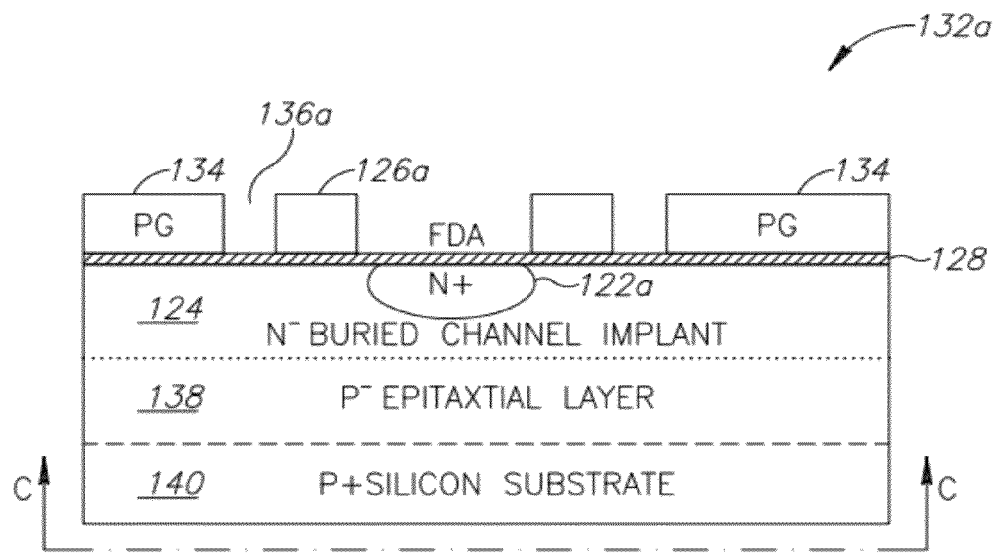
FIGS. 8B and 8C are vertical cross-sectional views taken along line B-B and C-C in FIG. 8A.
Figure 8C:
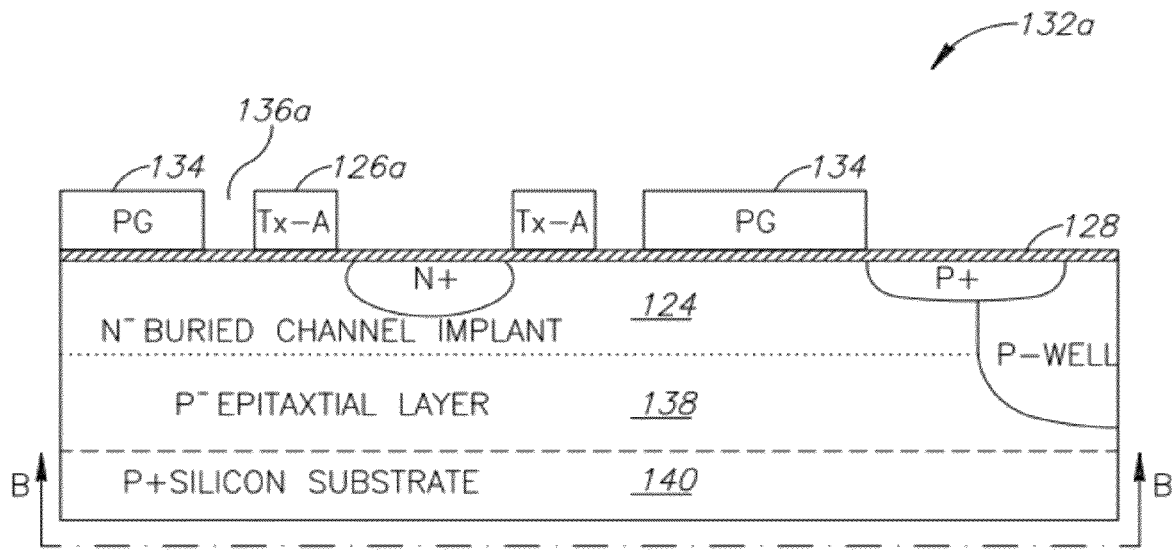

FIG. 8A, in plan view, and sectional views 8B and 8C illustrate the architecture of a basic unit cell, generally designated at 120, from which the photogate pixels according to an embodiment of the invention are formed. Unit cell 120 is comprised of three substantially circular N+ floating diffusions 122a, 122b, and 122c formed within an N⁻ buried channel implant 124. Polycrystalline silicon transfer gates 126a, 126b, and 126c are located on an oxide layer 128 formed on channel implant 124 (FIGS. 8B, 8C). Transfer gates 126a-126c are in the form of rings surrounding diffusions 122a-122c respectively. Floating diffusion 122a and transfer gate 126a, and floating diffusion 122b and transfer gate 126b respectively form first and second charge sensing elements 132a and 132b. Floating diffusion 122c and transfer gate 126c forms a background charge draining element 132c which provides background illumination cancellation.

A polycrystalline silicon photogate 134 is also formed on oxide layer 128 as a continuous generally planar layer covering substantially the entire area of the upper surface of cell 120. Generally circular apertures 136a-136c are aligned with charge sensing elements 132a and 132b and background charge draining element 132c. Apertures 136a-136c provide a suitable clearance to expose these elements for convenient wiring access and to provide substantially uniform 360° electric field distribution for charge transfer through channel 124.

As best seen in FIGS. 8B and 8C, the basic structure of the portions of unit cell 120 other than charge sensing elements 132a and 132b, background charge draining element 132c, and photogate 134 may be of conventional CMOS constructions. It may be comprised, e.g., of N⁻ implant 124, previously mentioned, a P⁻ epitaxial layer 138 and a P+ silicon substrate 140, along with the required metal drain and source planes and wiring (not shown). Alternatively, any other suitable and desired architecture may be employed.

Figure 4:
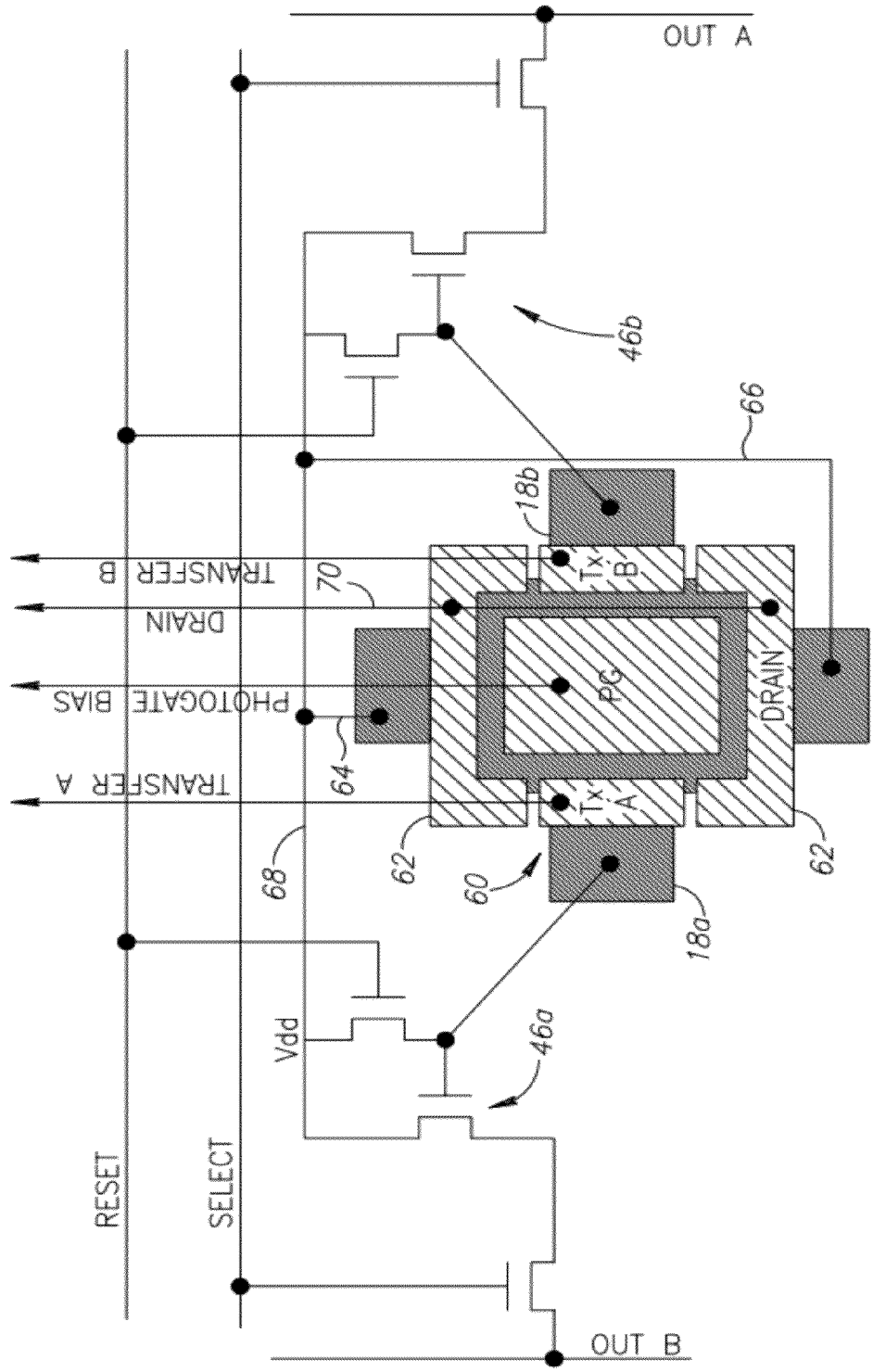
FIG. 4 is a schematic diagram in plan view of the cell of FIGS. 3A and 3B including provision for background light cancellation.
Figure 5:
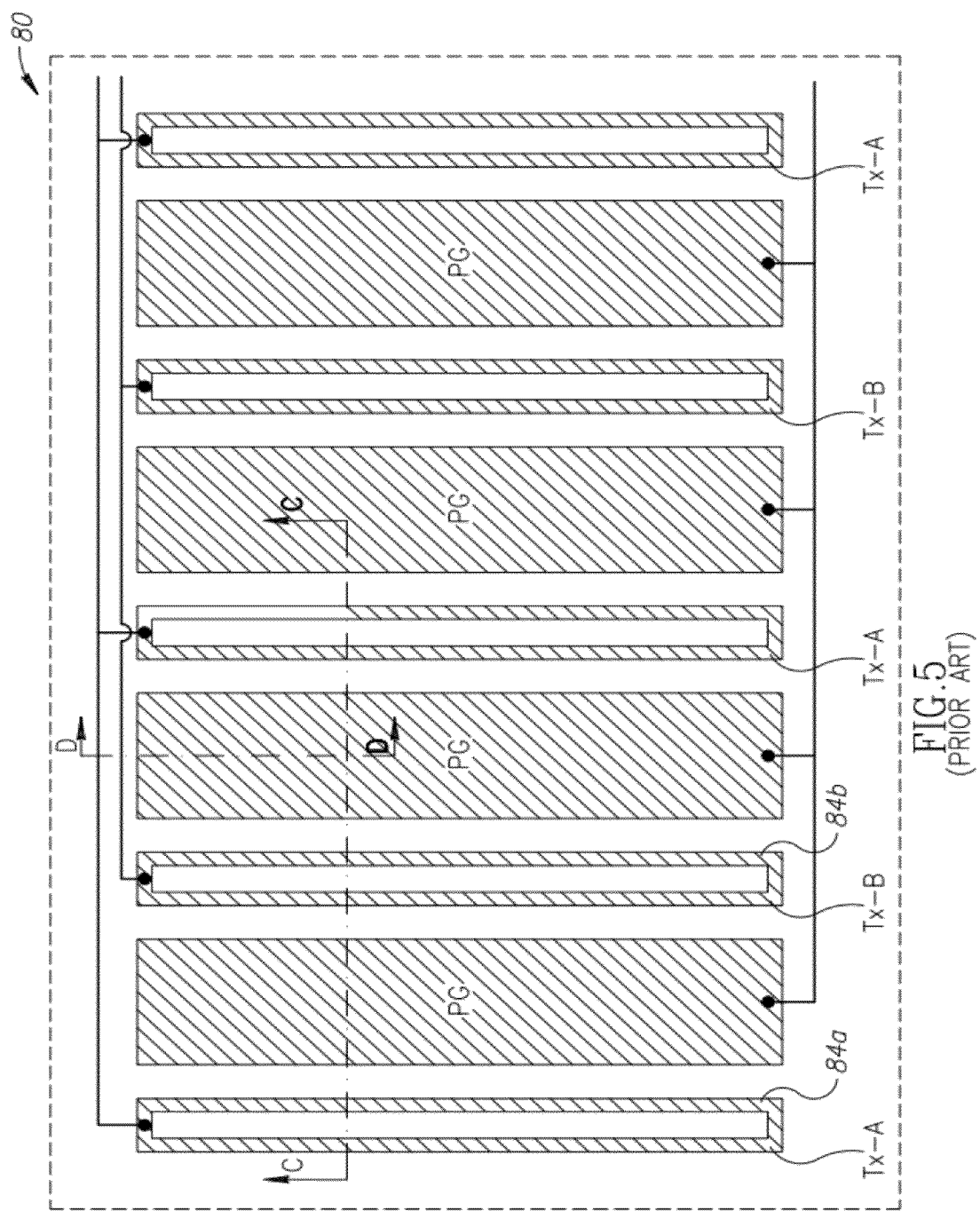
FIG. 5 is an enlarged photo-representation of a conventional CMOS pixel constructed of cells as shown in FIGS. 1A-3B.
Figure 6B:
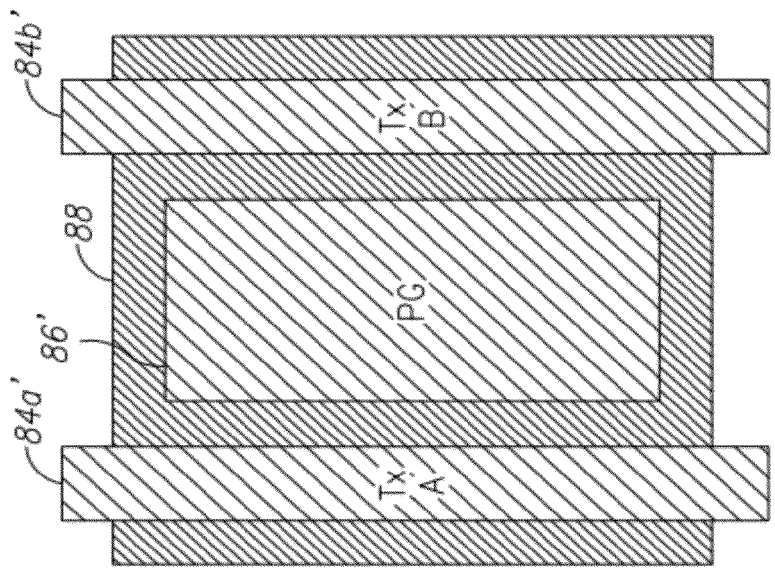
FIGS. 6A and 6B are schematic plan views of alternatives for the photogate structure shown in FIG. 5.
Figure 6A:
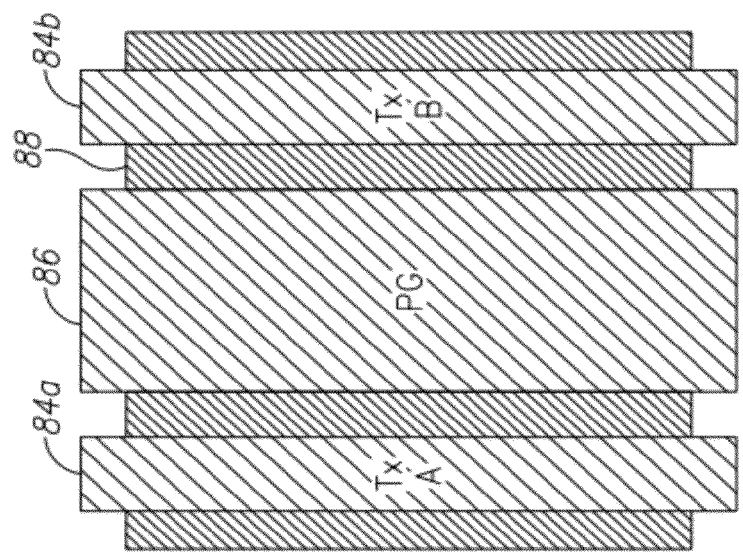
Figure 6C:
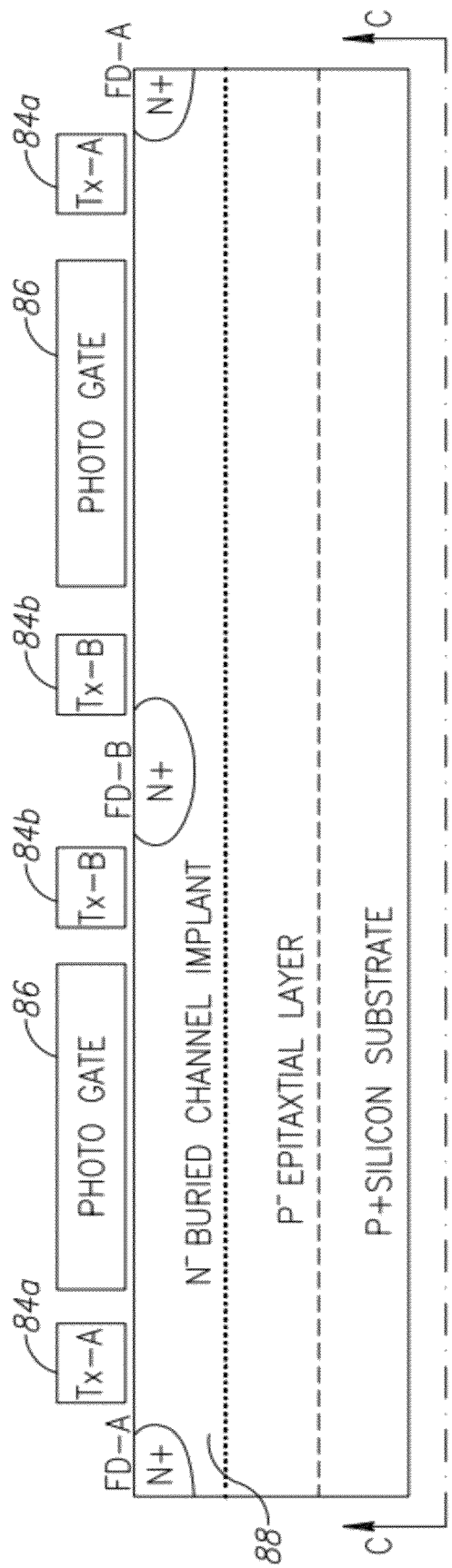
FIGS. 6C and 6D are vertical cross-sectional view taken along lines C-C and D-D in FIG. 5.
Figure 6D:
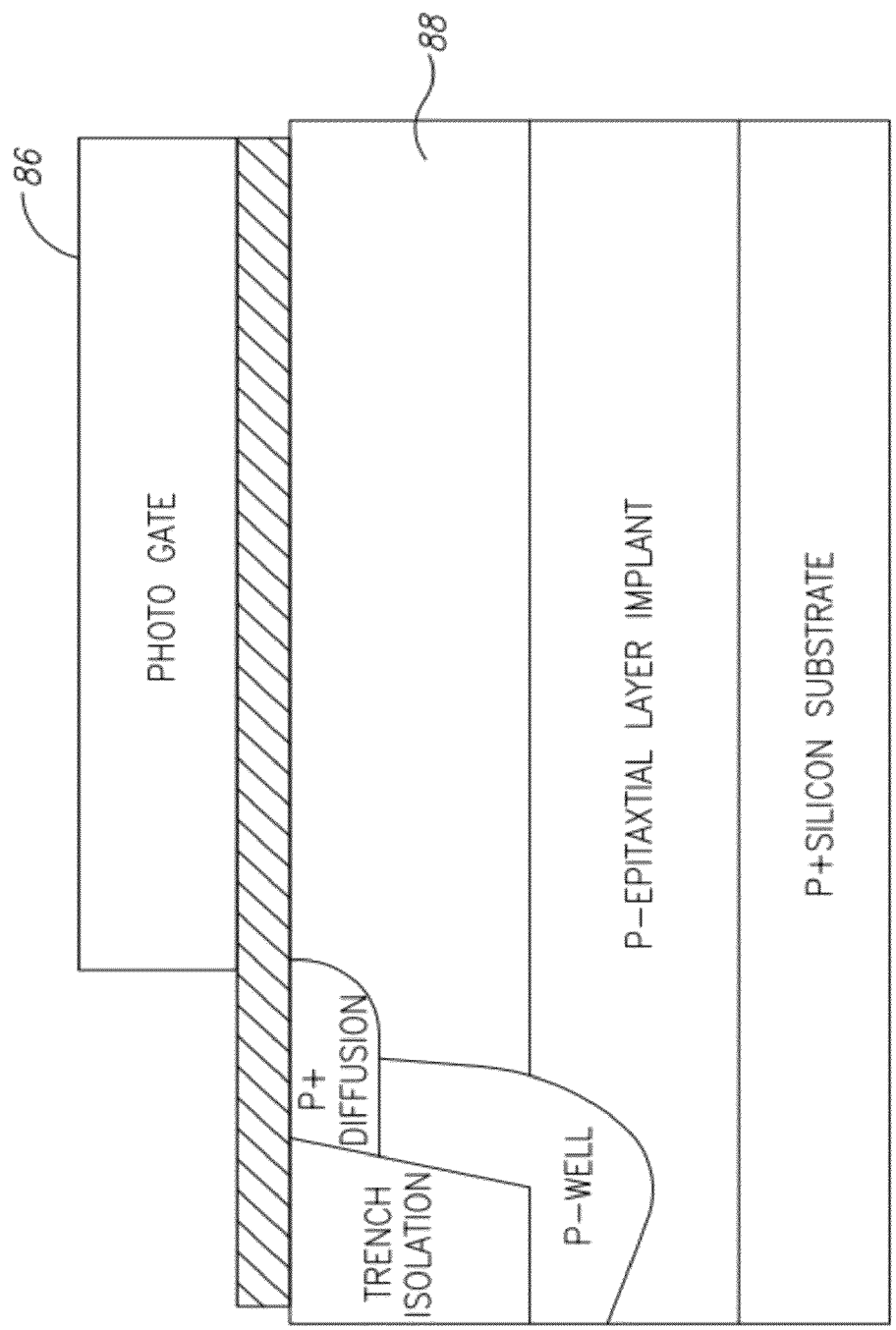

In connection with FIGS. 8B and 8C, it will be understood that only the geometry of charge sensing element 132a and photogate 134 is illustrated, but charge sensing element 132b and charge draining element 132c are essentially the same. It will also be understood that floating diffusions 122a and 122b are connected to suitable output circuitry (not shown) and floating diffusion 122c is connected to the drain bias potential Vdd, as in FIG. 4. (In the figures draining elements are also labeled "D" and charge sensing elements by "A" and "B")

Figure 9:
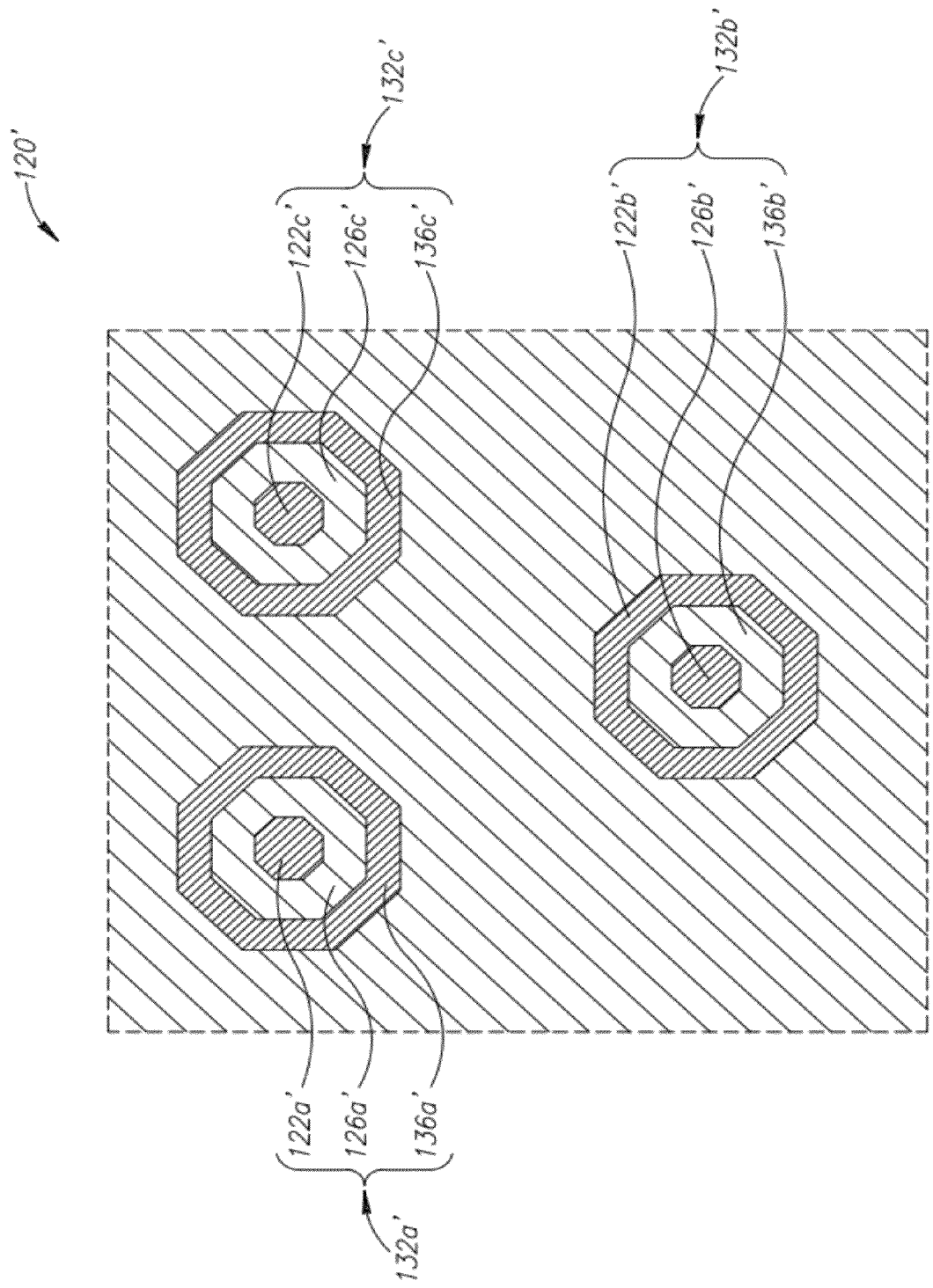
FIG. 9 is a plan view showing a variation of the basic cell of FIGS. 8A and 8B according to an embodiment of the invention that is adapted to the needs of CMOS fabrication technology in some instances.

FIG. 9 shows a variation of unit cell 120, generally designated at 120'. For some fabrication facilities, formation of substantially circular masking structures is not practical, and multi-sided apertures are preferred. Under such circumstances, charge sensing elements 132a' and 132b' and charge draining element 132c', along with apertures 136a'-136c' in photogate 134' may, for example, be octagonal. However, other shapes having a smaller or larger number of sides may also be employed successfully. Other things being equal, configurations having a larger number of sides, i.e., more nearly circular, tend to provide more uniform electric field distributions and faster charge transfer.

Figure 3A:
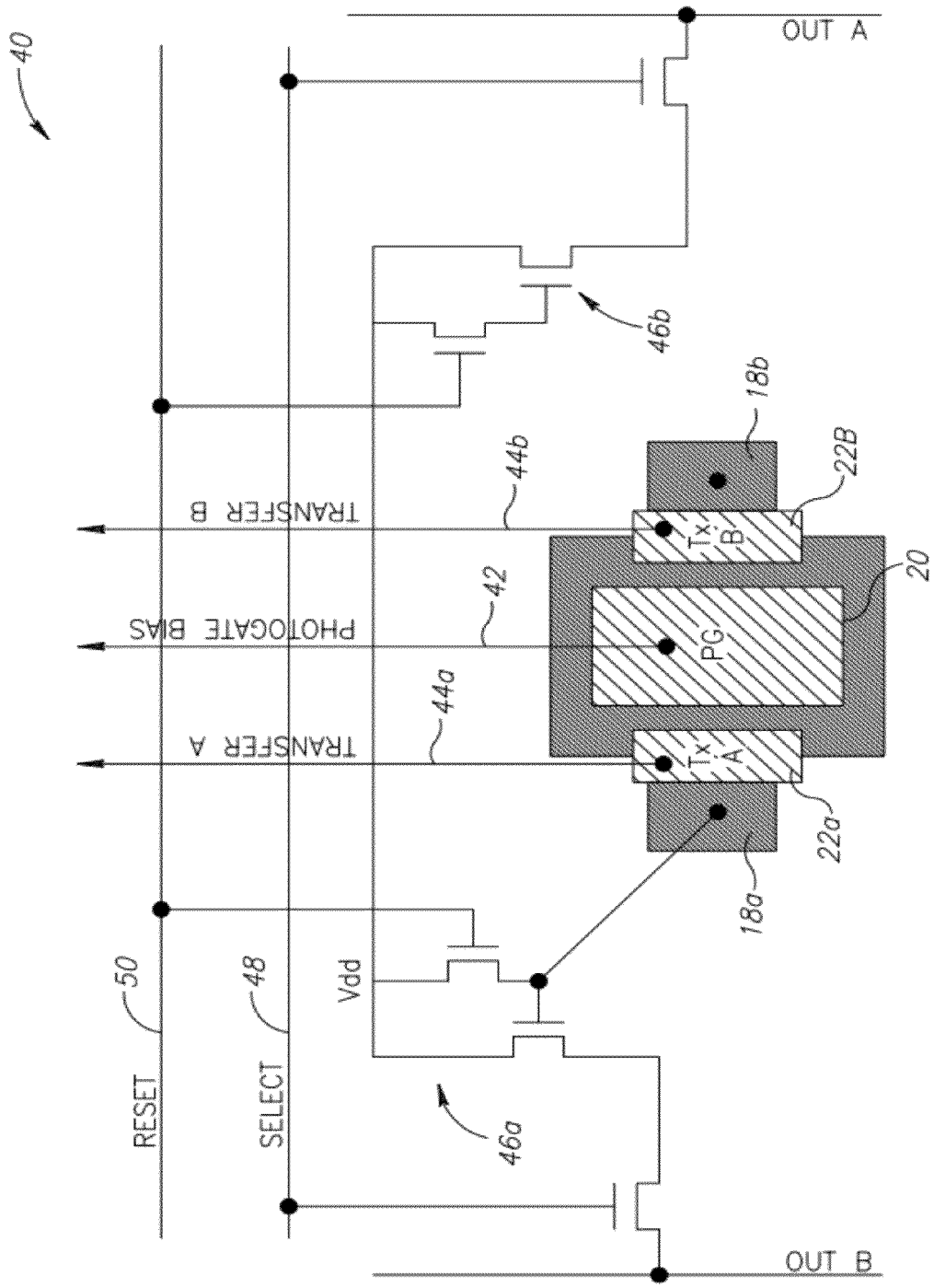
FIG. 3A is a schematic diagram in plan view of a conventional cell showing gate control and readout circuitry.
Figure 3B:
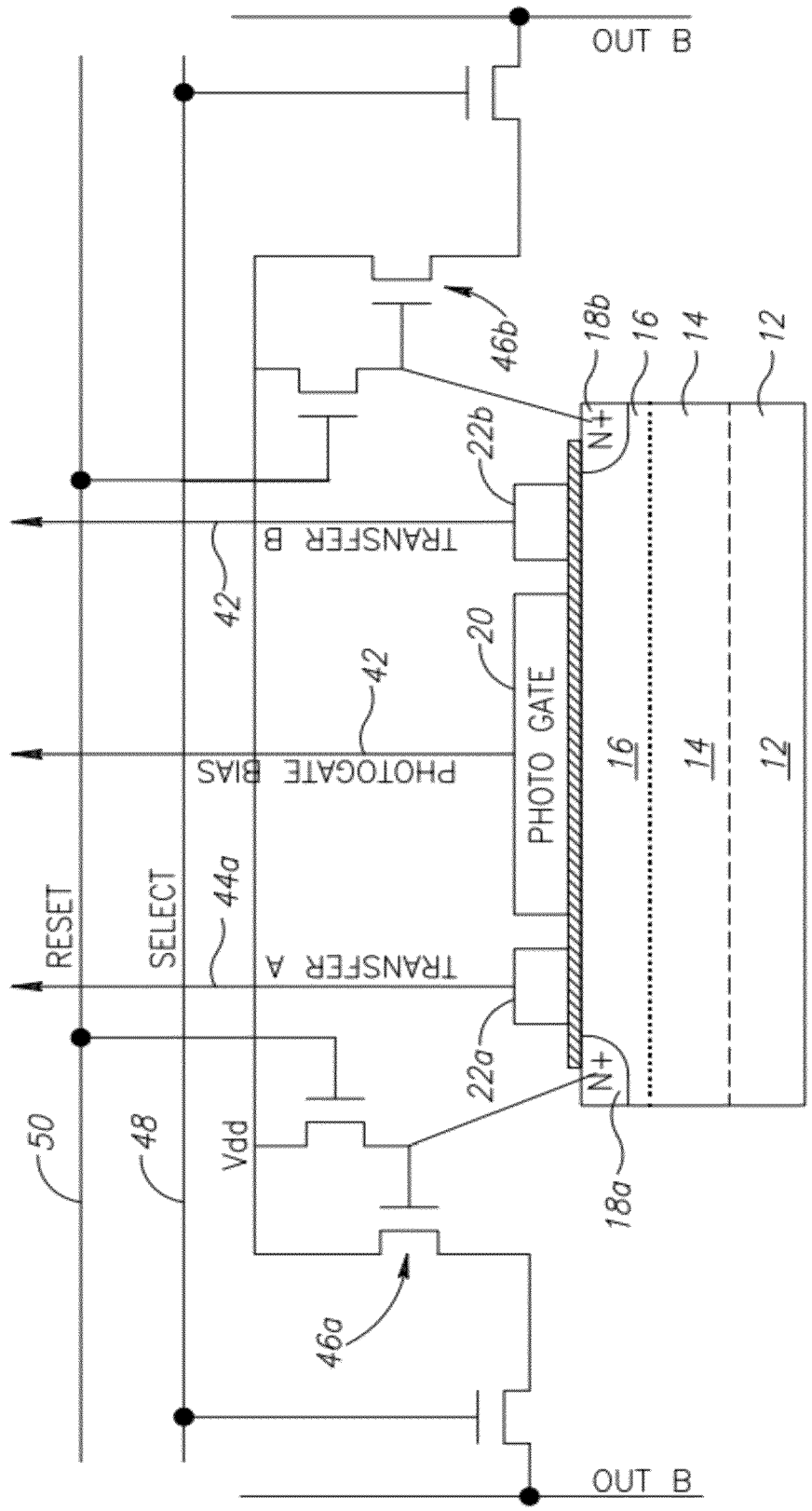
FIG. 3B is a vertical cross-sectional view taken along line B-B in FIG. 3A.
Figures 10, 11:
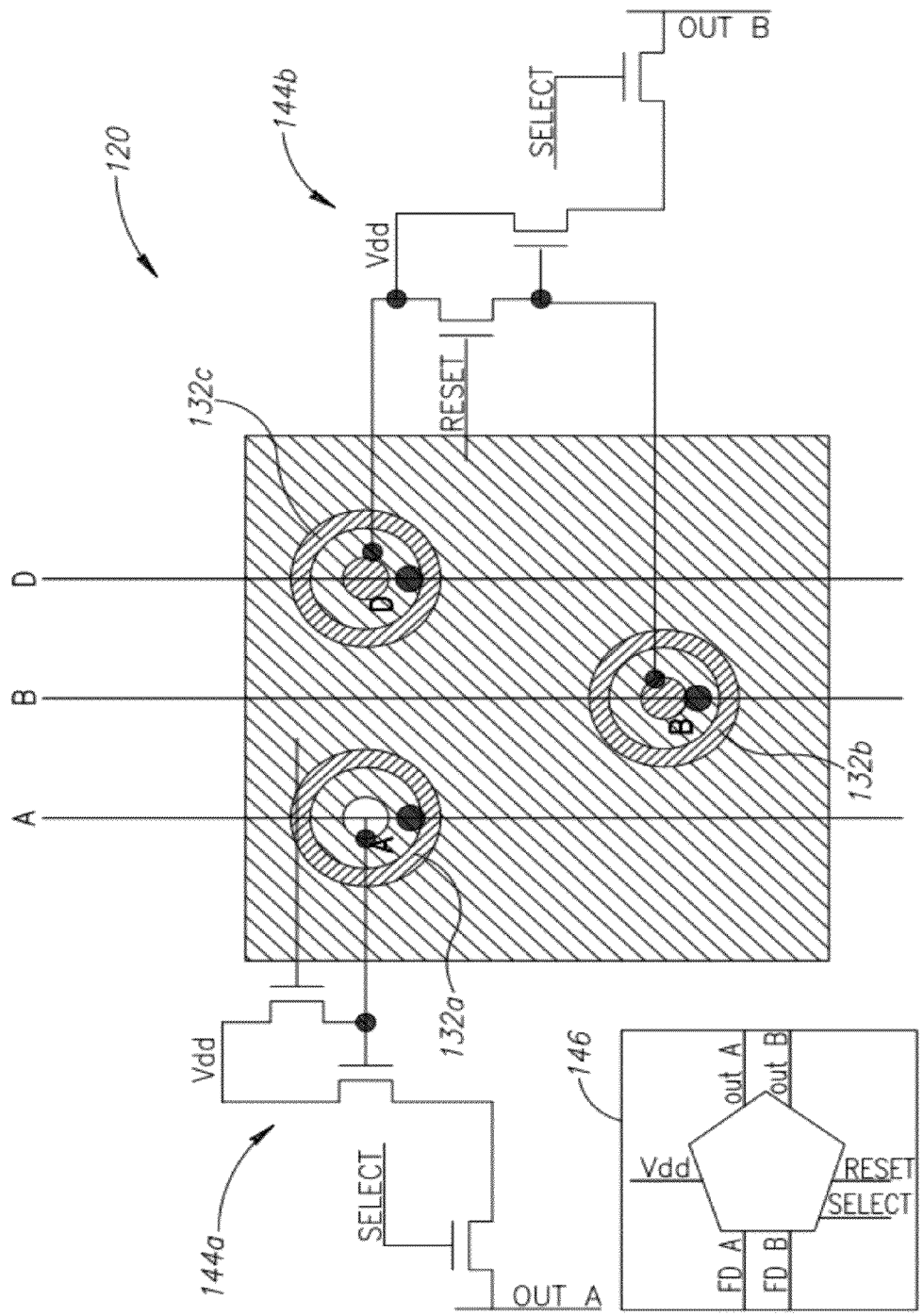
FIG. 10 is a schematic diagram in plan view showing an example of gate control and readout circuitry for the basic unit cell of FIGS. 8A-9 according to an embodiment of the invention.
FIG. 11 a block diagram element representing the readout circuitry shown in FIG. 10.

FIG. 10 illustrates schematically an exemplary wiring and output arrangement for a basic unit cell 120 as shown and described in connection with FIGS. 8A-8C. The output circuit 144a for charge sensing element 132a and output circuit 144b for charge sensing element 132b may be of conventional CMOS design, as discussed in connection with FIGS. 3A, 3B, and 4, and formed on the IC chip with basic unit cell 120. FIG. 11 shows output circuits 144a and 144b coalesced into a single block element 146 for convenient illustration in connection with the discussion to follow.

Figure 12:
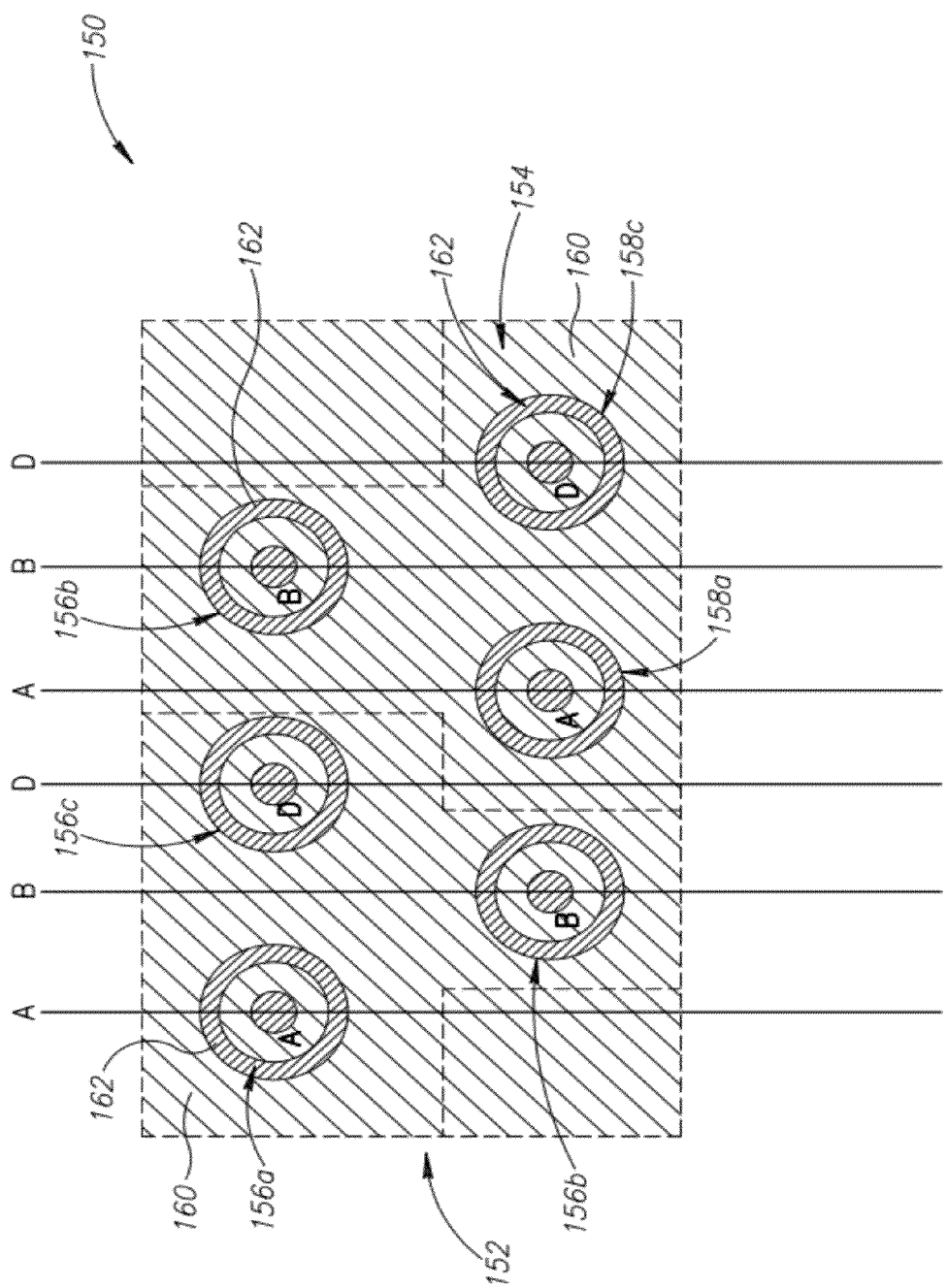
FIG. 12 is a schematic illustration of a first basic pixel building block according to an embodiment of the invention comprised of two basic unit cells as shown in FIGS. 8A-9 with the gate control and readout circuitry, and other conventional features omitted in the interest of clarity.

According to an embodiment of the invention, unit cells 120 (or 120') are combined as needed to provide the light-gathering capability for a particular application. FIG. 12 illustrates a basic multi-cell building block 150 comprised of two basic cells 152 and 154. Cell 152 includes sensing elements 156a and 156b, and background charge draining element 156c. Cell 155 includes sensing elements 158a and 158b, and background charge draining element 158c. As may be seen, building block 150 is formed with a single continuous photogate 160 with apertures 162 exposing the charge sensing and background charge draining elements.

A pixel may be formed of single building block 150, or a plurality of building blockes 150 may be combined as described below to form a pixel. Each pixel will be associated with an output driver circuit such as 146 (FIG. 11). The drivers may be formed on-chip with the pixel array, or separately, e.g., on another chip.

Simulation studies have been performed using Technology Computer Aided Design (TCAD) modeling software available from Synopsys Inc. of Mountain View, Calif., and described in detail on Synopsys' Website at http://www.synopsys.com/contactus.html. These studies indicate improvements of the present invention over conventional practice in providing low floating diffusion capacitance without degradation of charge transferability. Consideration of the resulting geometry likewise confirms improvements in fill factor.

Further, based on the simulation studies, and assuming maximum gate excitation of 3.3 v, 0.18 micron CMOS fabrication technology, and 70 Å gate oxide thickness, it has been determined that suitable approximate cell component dimensions may be in the following ranges:

Photogate perforation spacing (channel length) 1.0-6.0μ (e.g., 3.0μ)

Transfer gate annular width: 0.3-1.0 μm (e.g., 0.6 μm)

Photogate perforation to transfer gate clearance: 0.25-0.4μ (e.g., 0.25μ)

Diameter of floating diffusion: 0.6-1.5μ (e.g., 0.6μ).

It should be understood, however, that suitable dimensions may depend of applications, advancements in fabrication technology, and other factors, as will be apparent to persons skilled in the art, and that the above-stated parameters are not intended to be limiting.

Figure 13:
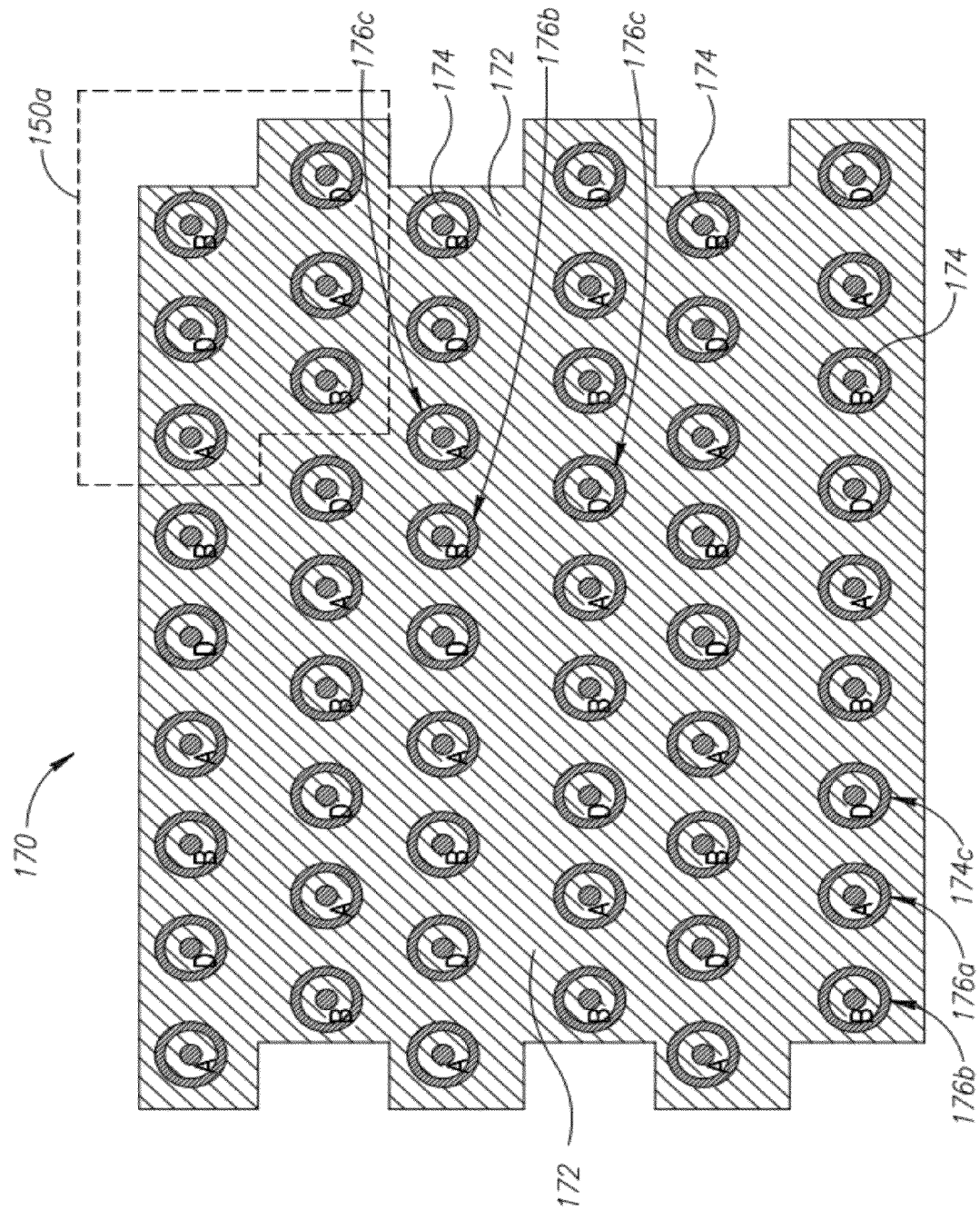
FIG. 13 is a schematic plan view according to an embodiment of the invention illustrating a 3×3 pixel array formed of the building blocks illustrated in FIG. 12.

Building blocks comprised of a plurality of two-unit cells 150 as illustrated in FIG. 12 may be combined to form individual pixels as shown in FIG. 13. Here, a single pixel 170 is formed of a three-by-three array of building blocks, one of which is indicated at 150a. It should be noted that a single continuous photogate 172 may be employed for the entire pixel. As previously described, apertures 174 are provided in photogate 172 to expose the individual charge sensing elements such as 176a and 176b, and background charge draining elements such as 176c. A single output driver (not shown) may be provided on-chip or as part of a separate unit, as previously mentioned.

Figure 14:
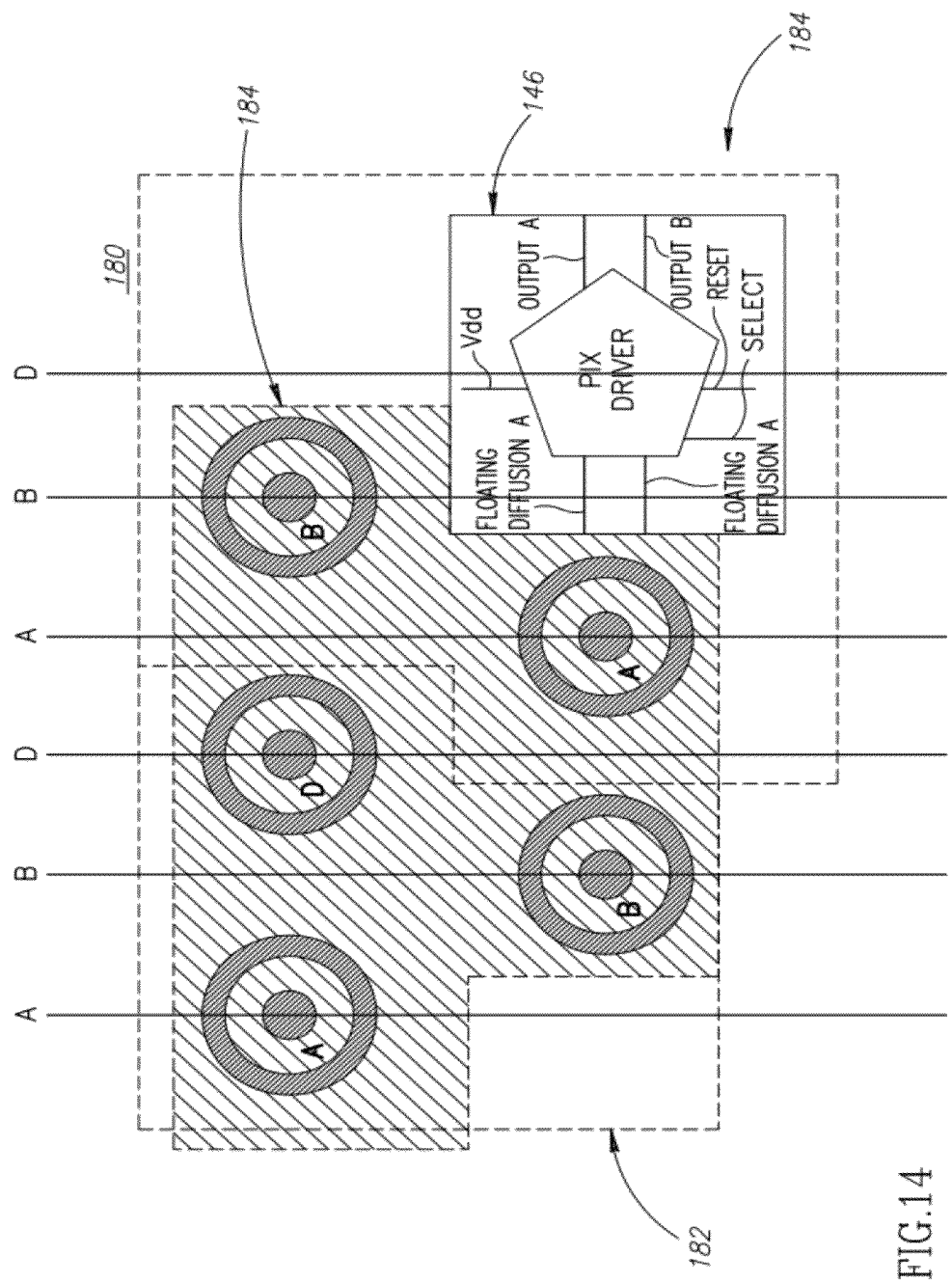
FIG. 14 shows a modification of the basic building block of FIG. 12 according to an embodiment of the invention that incorporates the readout circuitry of FIG. 11, and thereby forms a second basic pixel building block.

According to another exemplary embodiment of the invention, the building block 150 comprised of two basic unit cells as described in connection with FIG. 12 may be modified to form a second type of building block 180 illustrated in FIG. 14. Second building block 180 is comprised of a first unit cell 182 as described above, and a second unit cell 184 in which the background charge draining element is replaced by an output driver circuit 146 as illustrated in FIG. 11.

Figure 15:
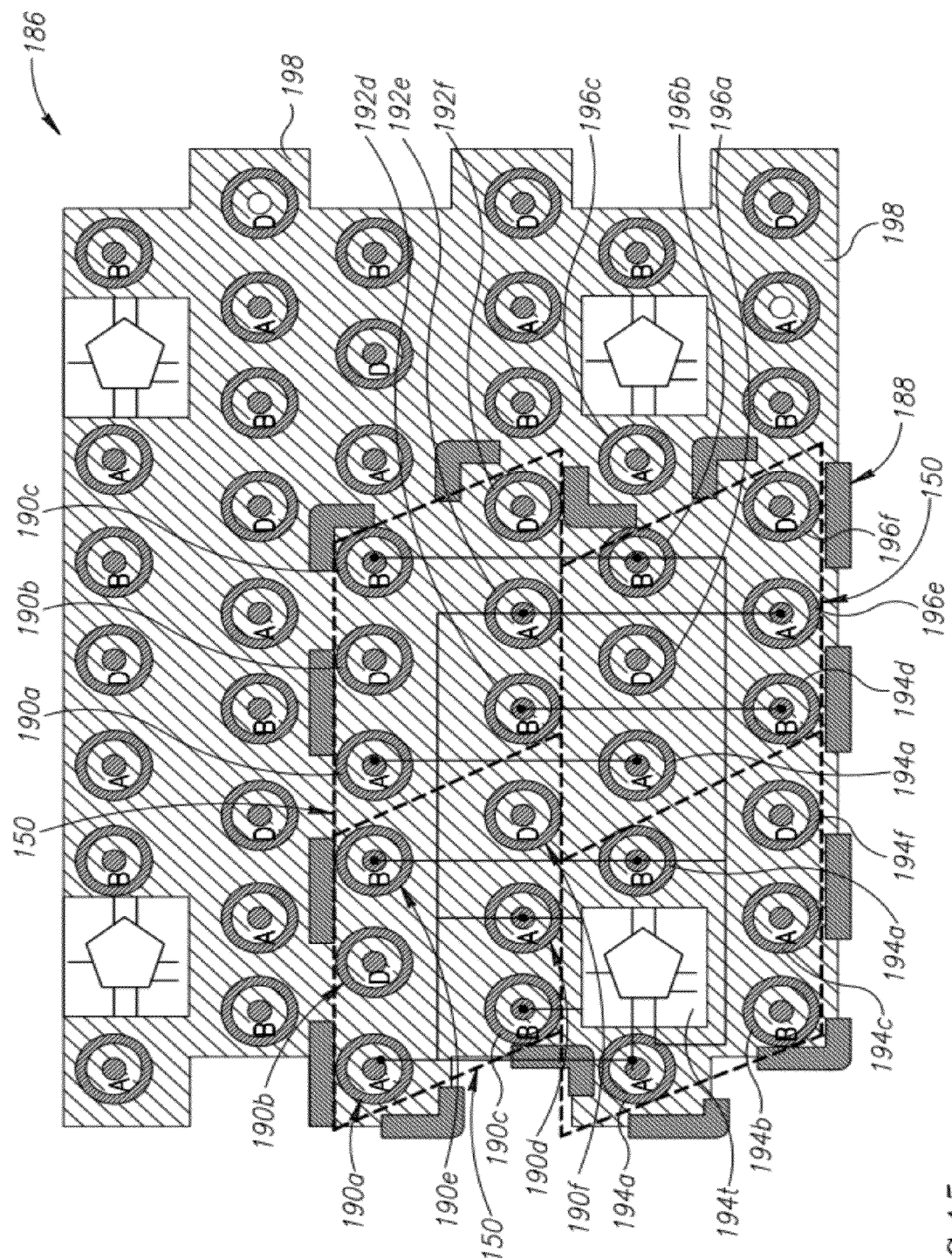
FIG. 15 is a schematic plan view of a pixel array according to an embodiment of the invention including a pixel comprised of three of the first type of pixel building blocks shown in FIG. 12 and one of the second basic pixel building blocks shown in FIG. 14.

One or more of the first type of building blocks may be combined with one of the second building blocks to form individual pixels. By way of example, FIG. 15 shows a part of a pixel array 186 including a single pixel 188 comprised of three building blocks 150 and one building block 180. The first instance of building block 150 includes elements 190a-190f. The second instance of building block 150 includes elements 192a-192f, and the third instance of building block 150 includes elements 196a-196f. Building block 180 is comprised of elements 194a-194f.

As in the previously described arrangements, a single continuous photogate 198 is provided, in this case, for the entire pixel array.

Figure 16B:
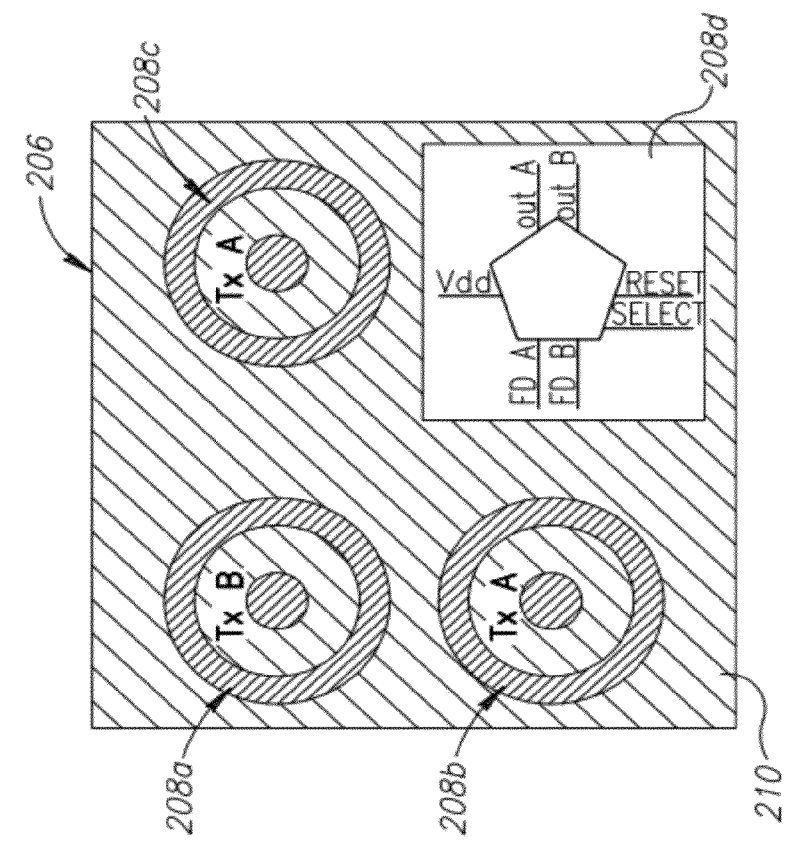
FIGS. 16A and 16B are schematic plan views of modified basic pixel building blocks according to an embodiment of the invention which do not incorporate background charge cancellation elements.
Figure 16A:
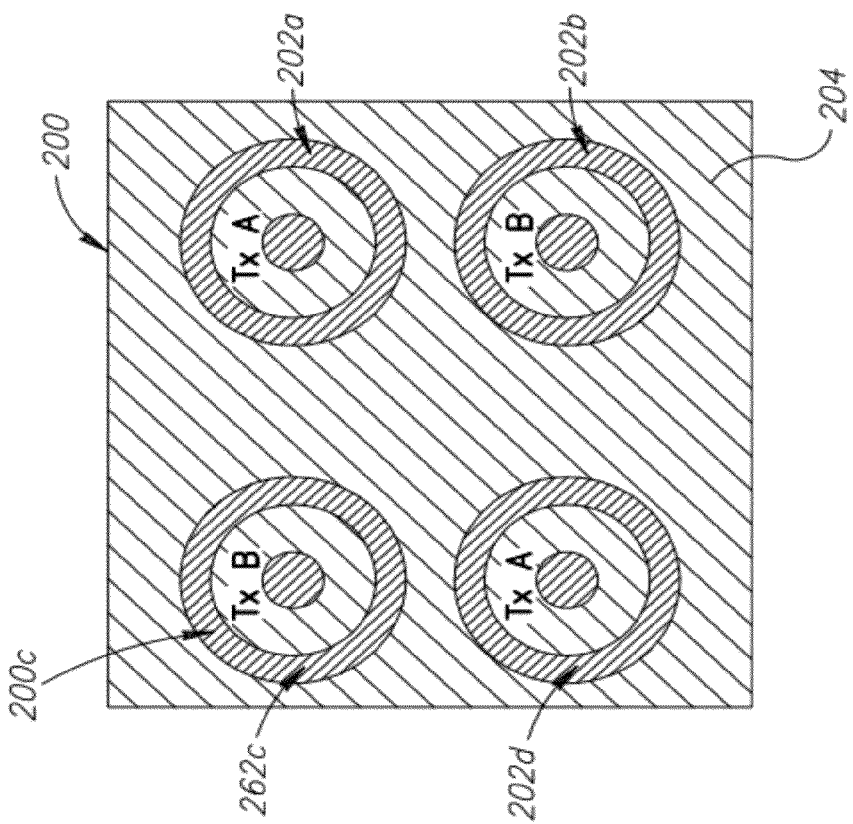

Optionally, in some instances, separate background charge cancellation elements may not be needed, for example, if the functionality is not required. However, the building block principle discussed above may still be applied, as illustrated in FIGS. 16A and 16B. A building block designated at 200 in FIG. 16A, is comprised of four basic unit cells 202a-202d, and a continuous perforated photogate 204. Similarly, a building block, generally designated at 206 in FIG. 16B, is comprised of three basic unit cells 208a-208c, an output driver 208d, and a continuous perforated photogate 210.

Figure 17:
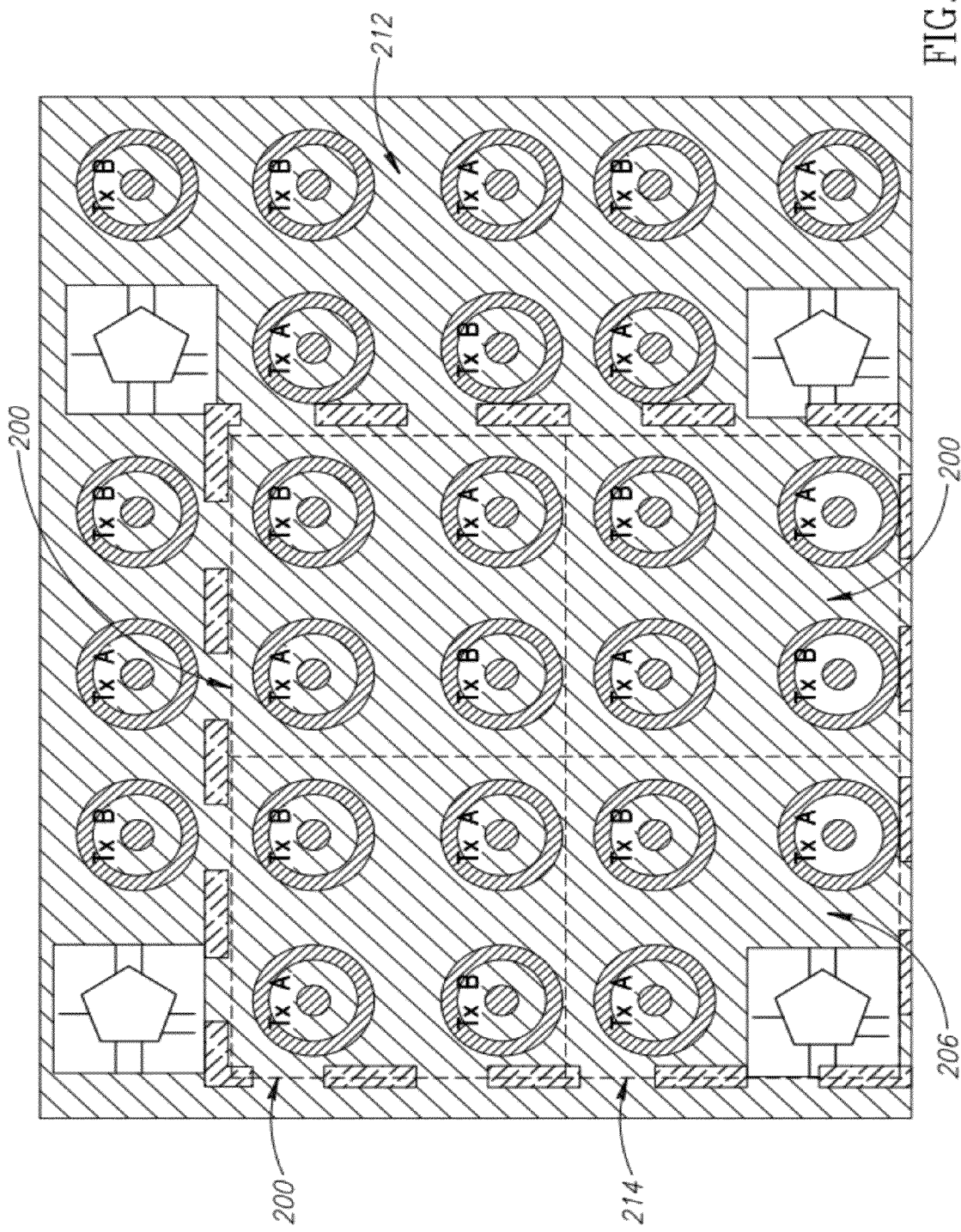
FIG. 17 is a plan view of a pixel according to an embodiment of the invention built up of three building blocks of the kind shown in FIG. 16A and one of the building blocks of the kind shown in FIG. 16B.
Figure 18:
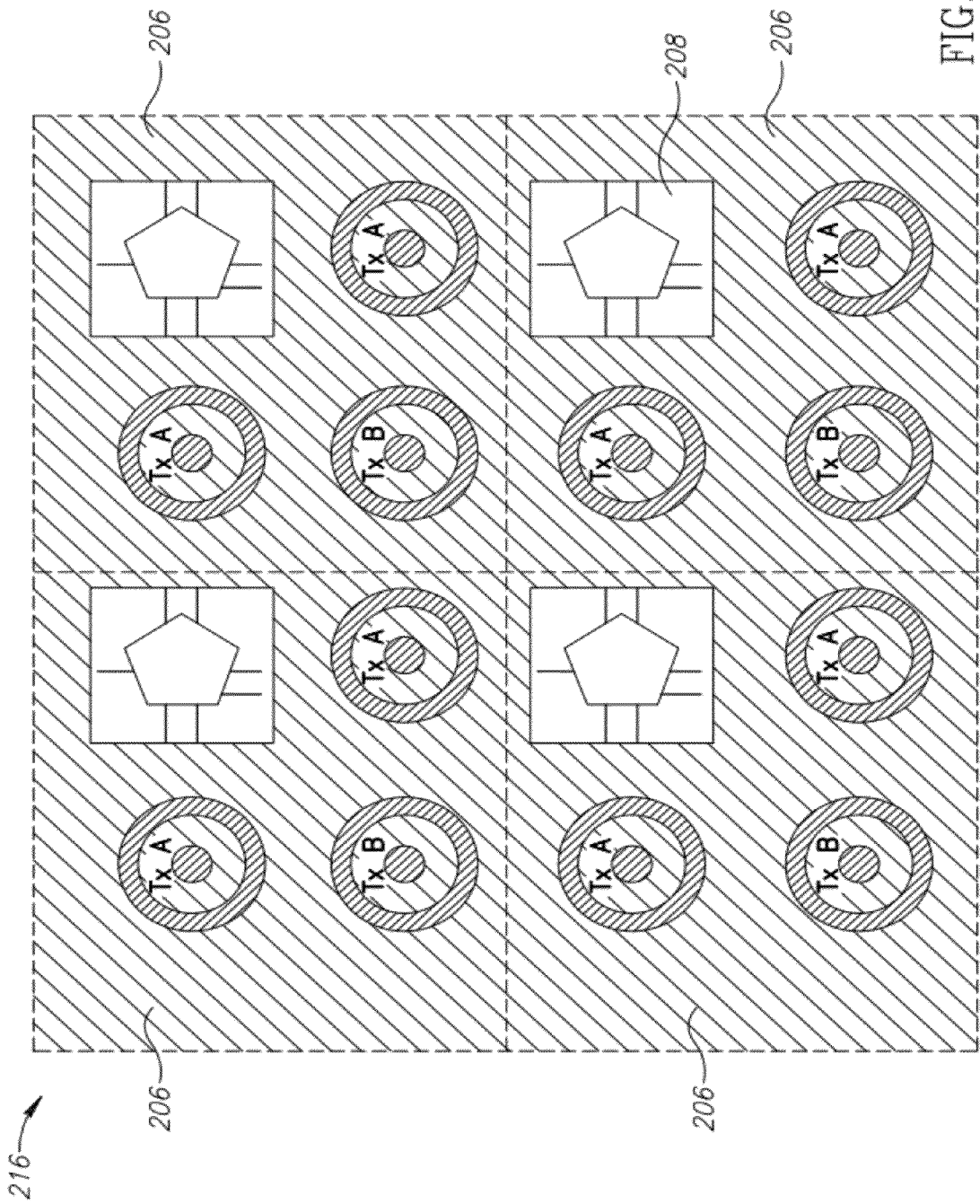
FIG. 18 is a plan view of an alternative pixel geometry according to an embodiment of the invention that is built up of four building blocks of the kind shown in FIG. 16B.

As will be understood, according to the light-gathering requirements of the application, one or more building blocks 200 may be combined with one building block 206. An example of such a construction is shown in FIG. 17. Here, a pixel array 212 is made up of pixels 214, which in turn, are comprised of three instances of building block 200 and one instance of building block 206. Optionally, in fact, a pixel can be formed of only building blocks 206 as illustrated at 216 in FIG. 18. In this connection, it will be understood that only one of the four output drivers 218 is required.

Figure 19:
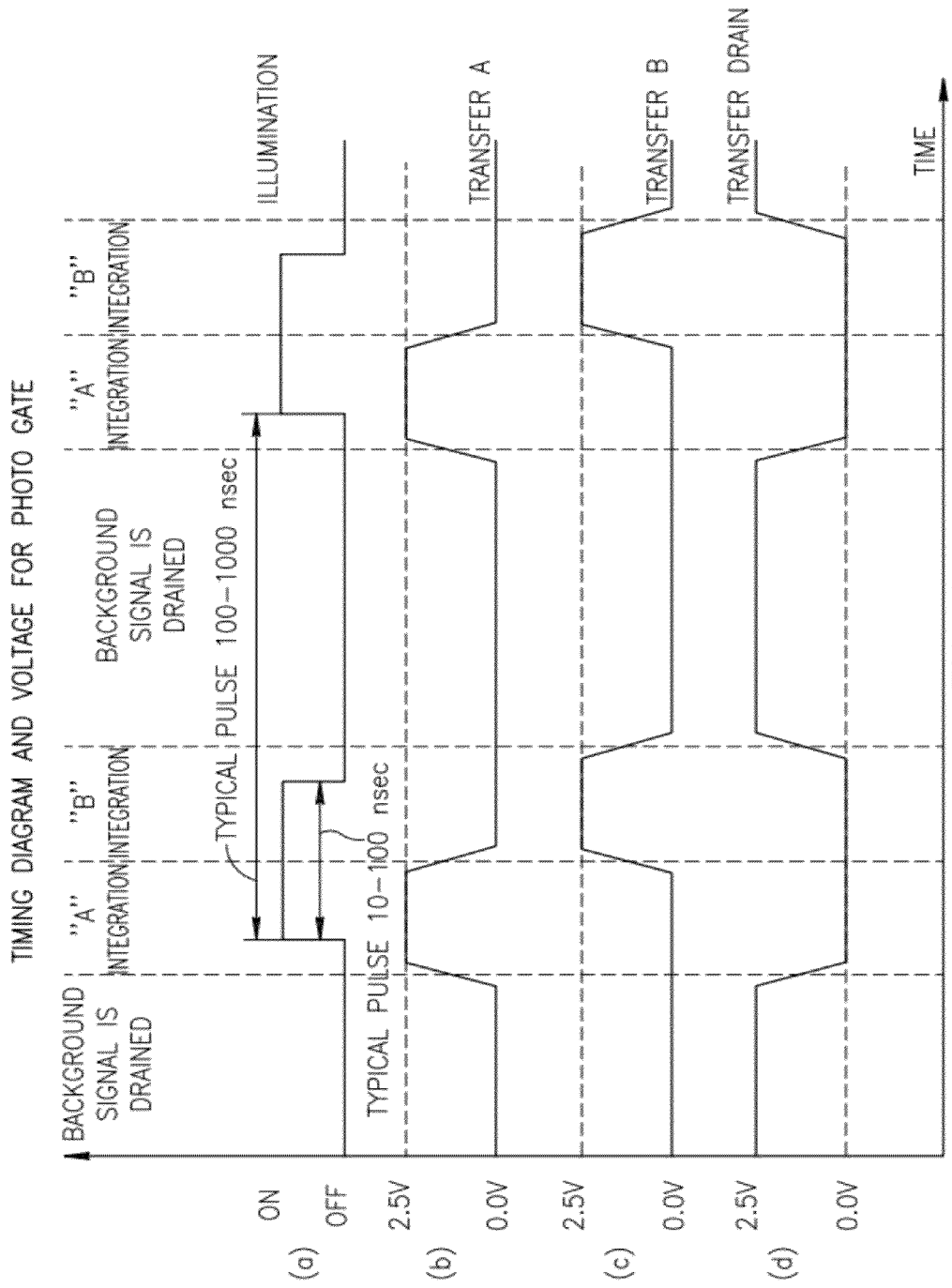
FIG. 19 is a timing diagram according to an embodiment of the invention that shows the relationship between the subject illumination cycle and the charge sensing integration intervals for the floating diffusions, and background cancellation.

FIG. 19 is an exemplary timing diagram for a basic unit cell according to some embodiments of the invention as described herein which provides background cancellation using a separate background charge draining element. Line (a) shows the illumination cycle. Lines (b) and (c) show the integration times for the "A" and "B" floating diffusions, and defined by the activation times for the respective "A" and "B" transfer gates. Line (d) shows the background cancellation interval, as defined by the activation time for the charge draining element transfer gate. As will be understood, the timing illustrated in FIG. 19 is also applicable to operation without background cancellation, or for embodiments in which the charge sensing element transfer gates and/or the photogate are used to activate background charge draining.

It should also be appreciated that other timing arrangements may also be employed, as shown, for example in copending international patent application PCT/IL2007/001571 filed 19 Dec. 2007 entitled "3D CAMERA AND METHODS OF GATING THEREOF", the entire disclosure of which is hereby incorporated herein by reference.

Figure 20A:
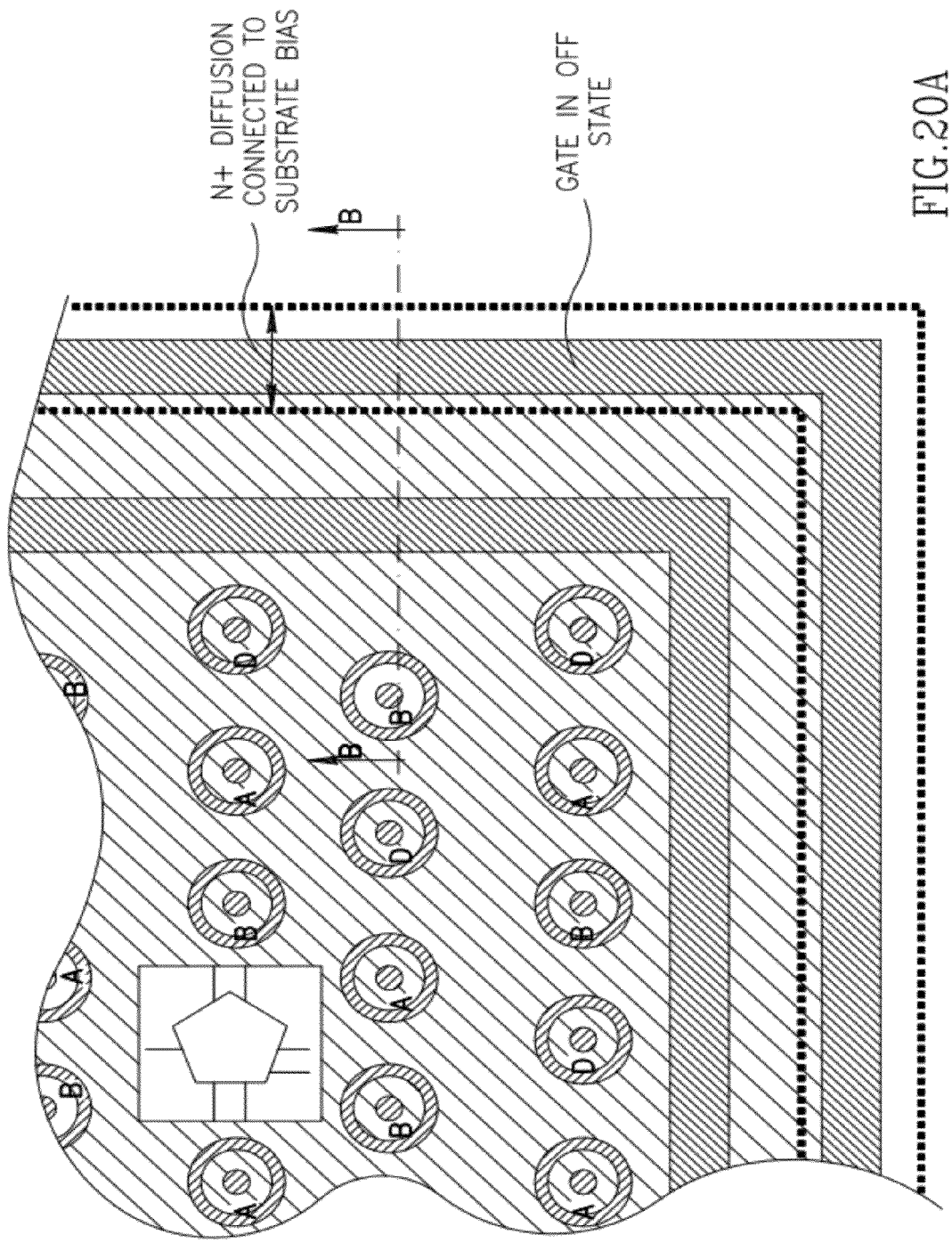
FIG. 20A shows an active stop channel arrangement according to an embodiment of the invention.
Figure 20B:
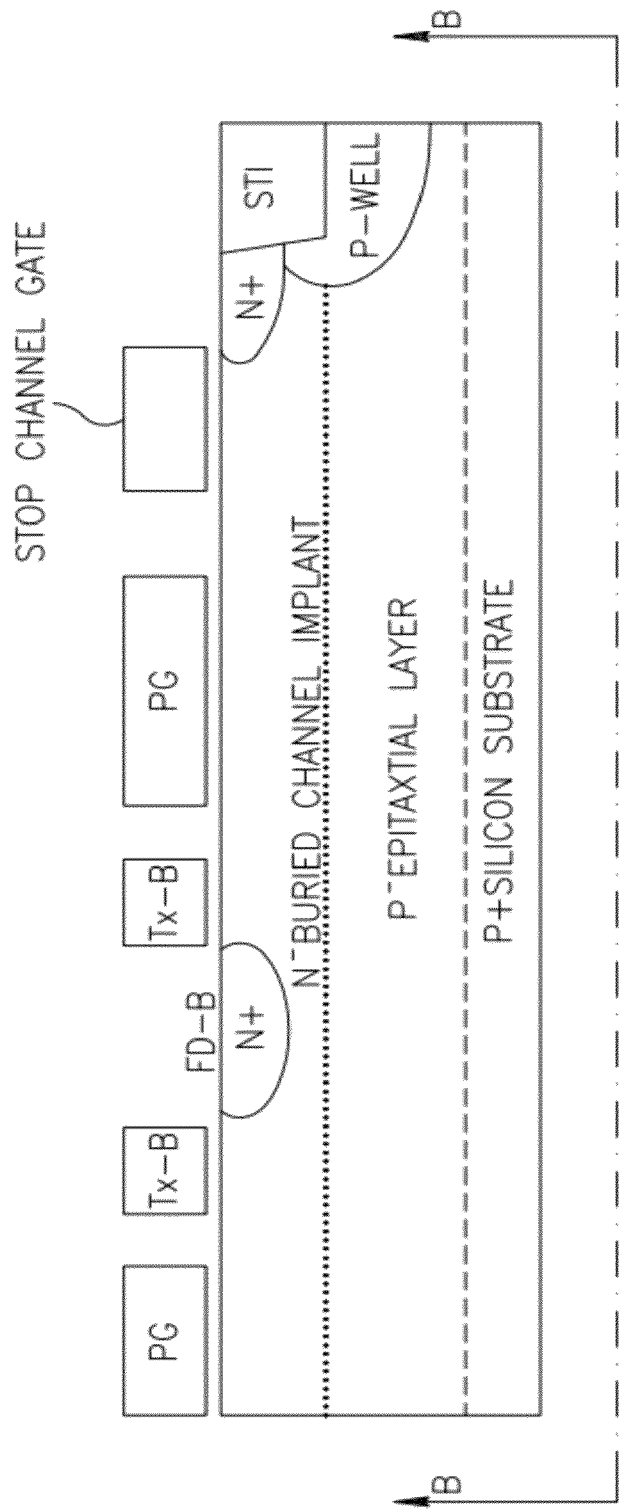
FIG. 20B is a vertical cross section taken along line B-B in FIG. 20A.

In some embodiments of the invention, the array of pixels is surrounded by a grounded isolation region shown in FIGS. 20A and 20B comprising a shallow trench isolation (STI) region that seats in a P-well surrounding the pixel array. An N+ diffusion borders the inside of the STI region and a stop gate channel surrounds the photogate and is located along and optionally slightly overlays the N+ diffusion. The stop gate channel, N+ diffusion, and STI well are biased at the substrate voltage.

The invention has been described with reference to embodiments thereof that are provided by way of example and are not intended to limit the scope of the invention. The described embodiments comprise different features, not all of which are required in all embodiments of the invention. Some embodiments of the invention utilize only some of the features or possible combinations of the features. Embodiments involving games other than those described are also possible, and application of the invention to such games are intended to be within the scope of the invention. Likewise, embodiments of the invention comprising different combinations of features than those noted in the described embodiments will occur to persons skilled in the art. The invention is therefore intended to be given the full scope permitted by the following claims.

The invention claimed is:

1. A photosurface for receiving and registering light from a scene, the photosurface comprising:
   a first semiconductor region in which electron-hole pairs are generated responsive to light incident on the photosurface;
   a single, first conductive region substantially overlaying all of the first semiconductor region;
   a plurality of second semiconductor regions, each surrounded by the first semiconductor region;
   a plurality of second conductive regions, each second conductive region surrounds an associated one of the second semiconductor regions and is electrically isolated from the first conductive region, each second conductive region has an opening, the associated second semiconductor region completely fills the opening;
   wherein when a respective one of the second conductive regions is electrified positive with respect to the first conductive region, electrons generated by light incident on the first semiconductor region are collected in the respective second semiconductor region, wherein electrons generated by light incident on the first semiconductor region migrate to the respective second semiconductor region from substantially all azimuthal directions relative to the second semiconductor region.

2. A photosurface according to claim 1 wherein the second semiconductor regions have a characteristic radial extent of about 0.6 microns.

3. A photosurface according to claim 1 wherein the second semiconductor regions have a characteristic radial extent of about 0.4 microns.

4. A photosurface according to claim 1 wherein the second semiconductor regions have a characteristic radial extent of about 0.3 microns.

5. A photosurface according to claim 1 wherein a distance between two nearest second semiconductor regions is less than or equal to about 9 microns.

6. A photosurface according to claim 1 wherein a distance between two nearest second semiconductor regions is less than or equal to about 6 microns.

7. A photosurface according to claim 1 wherein a distance between two nearest second semiconductor regions is less than or equal to about 4 microns.

8. A photosurface according to claim 1 wherein at least two of the plurality of second semiconductor regions are electrically connected by a conductor.

9. A photosurface according to claim 8 and comprising a circuit electrically connected to the plurality of second semiconductor regions configured to generate a signal responsive to a total number of electrons that migrate to the plurality of second semiconductor regions.

10. A photosurface according to any claim 1 and having a fill factor equal to or greater than about 40%.

11. A photosurface according to claim 1 and having a fill factor equal to or greater than about 50%.

12. A photosurface according to claim 1 and having a fill factor equal to or greater than about 60%.

13. A photosurface according to claim 1 and having a fill factor equal to or greater than about 75%.

14. A photosurface according to claim 1 wherein the at least one second semiconductor region comprises a floating diffusion.

15. A photosurface for imaging a scene comprising:
   a light sensitive region in which electron-hole pairs are generated responsive to light incident on the photosurface;
   a single photogate overlaying the light sensitive region;
   a plurality of charge collecting regions, each of which is surrounded by the light sensitive region and in which charge generated in the light sensitive region is stored; and
   for each of the charge collecting regions, a transfer gate that completely surrounds the charge collecting region, each transfer gate has an opening, the respective charge collecting region completely fills the opening, each transfer gate transfers charge from the light sensitive region to the charge collecting region within the opening of the respective transfer gate.

16. A photosurface according to claim 15 having a fill factor equal to or greater than about 40%.

17. A CMOS-type light detector cell comprising:
   a photogate;
   a channel implant in a structure underlying the photogate;

a plurality of floating diffusions formed within the channel implant; and a plurality of transfer gates, each transfer gate completely surrounds an associated one of the floating diffusions and is operable to permit electrons accumulated under the photogate to travel through the channel implant to the associated floating diffusion, wherein the photogate is a substantially continuous body extending over the channel implant, and includes a plurality of separate openings each of which surrounds one of the floating diffusions and its associated transfer gate, each of the transfer gates and its associated opening are aligned as concentric rings or a multi-sided shapes, each transfer gate having an inner opening with the associated floating diffusion positioned below and completely filling said inner opening.

18. The CMOS-type light detector cell of claim 17, wherein each transfer gate and associated opening are aligned as concentric circular rings, wherein said light detector cell includes a plurality of separate concentric circular rings.

19. The CMOS-type light detector cell of claim 17, wherein each transfer gate and associated opening are aligned as octagonal rings, wherein said light detector cell includes a plurality of separate concentric octagonal rings.

20. The CMOS-type light detector cell of claim 17, wherein a first of the transfer gates and its associated floating diffusion form a charge sensing element, a second of the transfer gates and its associated floating diffusion form a charge draining element.

\* \* \* \* \*